(12) United States Patent  
Alrod et al.

(10) Patent No.: US 10,114,549 B2  
(45) Date of Patent: Oct. 30, 2018

(54) ERROR CORRECTION CODE PROCESSING AND DATA SHAPING FOR REDUCING WEAR TO A MEMORY

(71) Applicant: Sandisk Technologies LLC, Plano, TX (US)

(72) Inventors: Idan Alrod, Herzeliya (IL); Eran Sharon, Rishon Lezion (IL); Ariel Navon, Revava (IL)

(73) Assignee: SANDISK TECHNOLOGIES LLC, Addison, TX (US)

( * ) Notice: Subject to any disclaimer, the term of this patent is extended or adjusted under 35 U.S.C. 154(b) by 142 days.

(21) Appl. No.: 15/073,373

(22) Filed: Mar. 17, 2016

(65) Prior Publication Data

US 2017/0269839 A1  Sep. 21, 2017

(51) Int. Cl.
| | | |
|---|---|---|
| *G06F 3/06* | (2006.01) | |
| *G11C 29/52* | (2006.01) | |
| *G06F 11/10* | (2006.01) | |
| *G11C 16/34* | (2006.01) | |

(52) U.S. Cl.
CPC ............ *G06F 3/0604* (2013.01); *G06F 3/064* (2013.01); *G06F 3/0679* (2013.01); *G06F 11/1012* (2013.01); *G06F 11/1068* (2013.01); *G11C 29/52* (2013.01); *G06F 2212/40* (2013.01); *G06F 2212/401* (2013.01); *G06F 2212/403* (2013.01); *G11C 16/34* (2013.01); *G11C 16/349* (2013.01); *G11C 16/3418* (2013.01); *G11C 16/3495* (2013.01); *G11C 2211/5647* (2013.01)

(58) Field of Classification Search
CPC ...... G06F 3/0604; G06F 3/0614; G06F 3/064; G06F 3/0679; G06F 11/004; G06F 11/08; G06F 11/1012; G06F 11/1048; G06F 11/1068; G06F 2212/40; G06F 2212/401; G06F 2212/403; G11C 29/52; G11C 16/34; G11C 16/3418; G11C 16/349; G11C 16/3495; G11C 2211/5647

See application file for complete search history.

(56) References Cited

U.S. PATENT DOCUMENTS 8,751,904 B2  6/2014  Wang et al.
8,874,994 B2  10/2014  Sharon et al.
(Continued)

OTHER PUBLICATIONS

PCT Application No. PCT/US2017/019456, International Search Report and Written Opinion of the International Searching Authority, dated May 18, 2017, 10 pages.

*Primary Examiner* — Christian M Dorman
(74) *Attorney, Agent, or Firm* — Michael Best & Friedrich LLP

(57) ABSTRACT

A device includes a memory and a controller including a data shaping engine. The data shaping engine is configured to apply a mapping to input data that includes one or more m-tuples of bits to generate transformed data. The transformed data includes one or more n-tuples of bits, and n is greater than m. A relationship of a gray coding of m-tuples to a gray coding of n-tuples is indicated by the mapping. The input data includes a first number of bit values that represent a particular logical state, and the transformed data includes a second number of bit values that represent the particular logical state, the second number of bit values being less than the first number of bit values.

40 Claims, 8 Drawing Sheets

(56) References Cited

U.S. PATENT DOCUMENTS

| | | | |
|---|---|---|---|
| 2008/0291724 A1* | 11/2008 | Litsyn | G06F 11/1072 365/185.03 |
| 2012/0023387 A1* | 1/2012 | Wang | G06F 11/1048 714/773 |
| 2013/0024746 A1* | 1/2013 | Sharon | G06F 11/1072 714/766 |
| 2013/0054876 A1 | 2/2013 | Varanasi | |
| 2013/0103891 A1* | 4/2013 | Sharon | G06F 12/0246 711/103 |
| 2013/0191579 A1 | 7/2013 | Sharon et al. | |
| 2014/0108714 A1* | 4/2014 | Lee | G06F 3/061 711/103 |
| 2014/0143631 A1 | 5/2014 | Varanasi | |
| 2014/0297933 A1* | 10/2014 | Oh | G06F 12/0246 711/103 |

\* cited by examiner

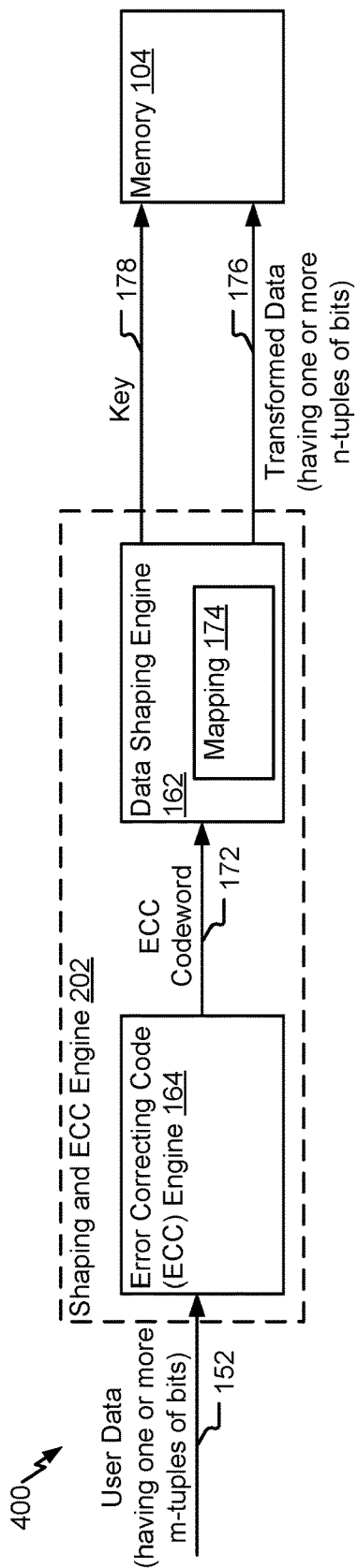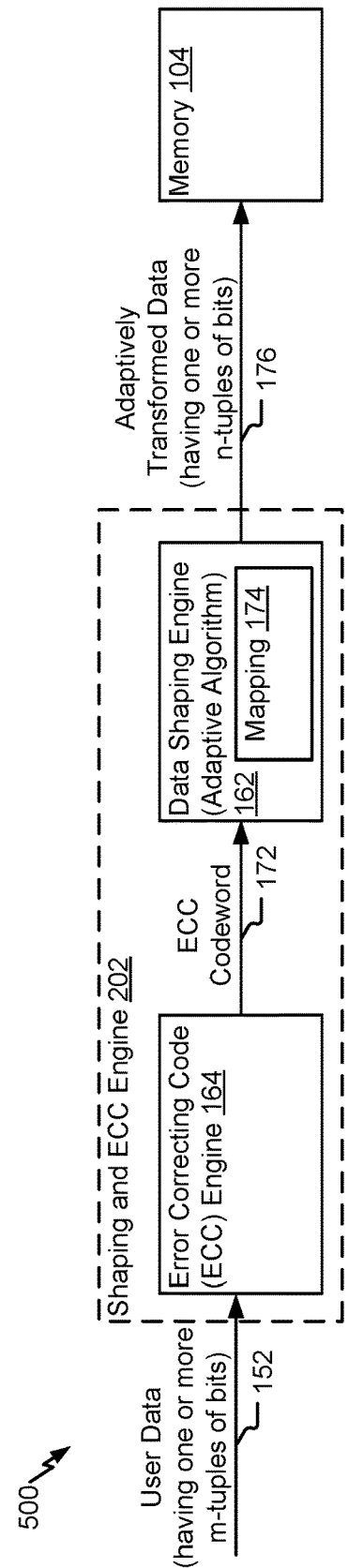
FIG. 4
FIG. 5

ERROR CORRECTION CODE PROCESSING AND DATA SHAPING FOR REDUCING WEAR TO A MEMORY

FIELD OF THE DISCLOSURE

The present disclosure is generally related to error correction code processing and data shaping.

BACKGROUND

Data stored in a memory, such as a non-volatile memory, may cause wearing of the memory. For example, programming memory cells to have a high threshold voltage (e.g., corresponding to a logical "0" value) may cause wearing of the cells faster than programming the cells to a lower threshold voltage or maintaining the cells in an erase state (e.g., corresponding to a logical "1" value). To reduce wear, data may be "shaped" prior to being stored in the memory. Shaped data may include fewer bits having a particular logical value (e.g., a logical "0" value) such that writing the shaped data to the memory reduces wear by reducing the number of cells programmed with a high threshold voltage. However, in cases where the data is uniformly random, shaping data increases the size of data (e.g., shaped data is larger than unshaped input data). In some examples, data (such as a code word including a data portion and parity portion) is to be stored at the memory. However, in cases where the data is not random, data shaping techniques can shape the data portion but not the parity portion as the parity portion is still uniformly random. One technique for reducing wear on cells caused by storing the unshaped parity data to specific cells in the array is to shift a position of the unshaped parity data in a code word prior to storage at the memory so that the unshaped parity data is written to different physical storage elements (e.g., same physical word line) during different write cycles. However, shifting the position of the unshaped parity data and detecting a location of the unshaped parity data when decoding increases complexity and cost of a data storage device.

BRIEF DESCRIPTION OF THE DRAWINGS

FIG. 4 is a diagram that illustrates an example of a system that is configured to generate transformed data using a first mapping (e.g., a static mapping);

FIG. 5 is a diagram that illustrates an example of a system that is configured to generate transformed data using a second mapping (e.g., an adaptive mapping);

DETAILED DESCRIPTION

Figure 1:
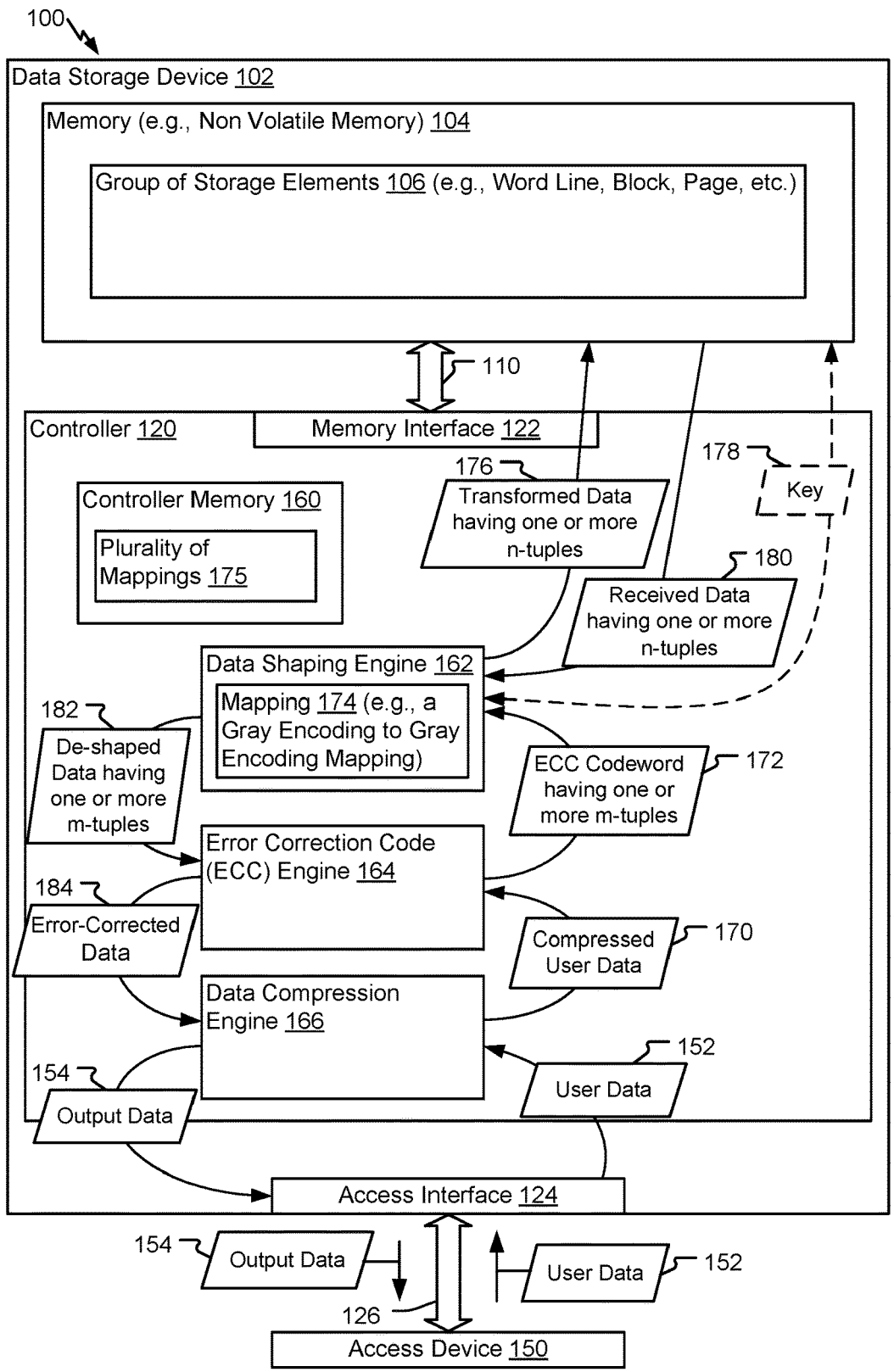
FIG. 1 is a block diagram of a first illustrative example of a system including a device configured to apply a mapping to input data to generate transformed data (e.g., shaped data)

Particular implementations are described with reference to the drawings. In the description, common features are designated by common reference numbers throughout the drawings. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, an m-tuple of bits refers to a string of m bits, and an n-tuple of bits refers to a string of n bits, where m and n are positive integers. Hereinafter, an m-tuple of bits is referred to as an "m-tuple," and an n-tuple of bits is referred to as an "n-tuple."

The present disclosure describes systems, devices, and methods of applying a mapping to input data to generate transformed data (e.g., shaped data) that reduces a number of bit values having a particular value (e.g., a logical "0" value or a particular multi-bit value). The present disclosure also describes systems, devices, and methods of applying a second mapping (e.g., a reverse mapping) to a transformed data representation read from a memory to generate output data. The mapping applied to the input data may be determined such that one or more bit errors in the transformed data representation do not impact the second mapping (e.g., the reverse mapping).

A data shaping engine is configured to encode (e.g., shape) input data to generate transformed data for storage in a memory. The input data includes one or more m-tuples (a first number of m-tuples) and the transformed data includes one or more n-tuples (a second number of n-tuples), where n is greater than m. The first number and the second number are the same. To generate the transformed data, the data shaping engine applies a mapping to a first m-tuple (of the input data) to generate an n-tuple. The m-tuple may have more bits that have a particular logical value than the n-tuple (e.g., the n-tuple has fewer logical "0" values than the m-tuple). In a particular implementation, the mapping maps a gray coding of m-tuples to a gray coding of n-tuples. For example, in the mapping, m-tuples of input data may be arranged in a gray coding (e.g., m-tuples may be arranged in an order in which two successive m-tuples differ by a single bit), n-tuples of transformed data may be arranged in a gray coding (e.g., n-tuples may be arranged in an order in which two successive n-tuples differ by a single bit), and the mapping may indicate a one-to-one mapping of m-tuples to n-tuples. Alternatively, the mapping includes a one-to-one encoding mapping and a many-to-one decoding mapping. In both implementations, the transformed data (e.g. the n-tuples) may be shaped to reduce wear to the memory. In some implementations, the input data may be compressed prior to shaping, and the transformed data (after data shaping) has the same size as the input data prior to compression. Thus, in some implementations, input data (e.g., user data) may be shaped to reduce wear without increasing a size of the input data. In a particular implementation, 'm' and 'n' are equal and a gray coding is applied in the memory itself. The transformation mapping favors the n-tuples which correspond to states of the memory (e.g., a NAND memory) which are represented by lower voltage regions.

The data shaping engine is also configured to decode (e.g., de-shape) a transformed data representation (e.g., read transformed data that may include bit errors) from the memory to generate output data that corresponds to the input data. The data shaping engine may identify an n-tuple of the transformed data representation and de-shape the n-tuple of the transformed data representation to generate an m-tuple of output data (e.g., de-shaped data). In a particular implementation, the mapping includes a one-to-one encoding mapping (e.g., a mapping that maps a gray coding of m-tuples to a gray coding of n-tuples) and a one-to-one decoding mapping (e.g., a reverse mapping that maps a gray coding of n-tuples to a gray coding of m-tuples). In this implementation, when the n-tuple of the transformed data representation matches an n-tuple of the decoding mapping, the n-tuple of the transformed data representation is de-shaped to a corresponding m-tuple according to the decoding mapping. When the n-tuple of the transformed data representation does not match an n-tuple of the decoding mapping, a particular n-tuple of the decoding mapping that has the least difference (e.g., a Hamming distance) from the n-tuple of the transformed data representation is selected, and the selected n-tuple is de-shaped to a corresponding m-tuple according to the decoding mapping. In an alternate implementation, the mapping includes a one-to-one encoding mapping and a many-to-one decoding mapping. In this implementation, groups of n-tuples are mapped to a single m-tuple in the many-to-one decoding mapping, and the n-tuple of the transformed data representation is de-shaped to a corresponding m-tuple according to the many-to-one decoding mapping. Thus, the n-tuple of the transformed data representation may be decoded (e.g., de-shaped) into an m-tuple of output data using a decoding mapping (e.g., the one-to-one decoding mapping or the many-to-one decoding mapping). In this manner, the data shaping engine may be able to decode an n-tuple of the transformed data representation including one or more bit errors to an m-tuple of output data. The decoding (using the decoding mapping) may be done without identifying bit errors and/or without correcting bit errors prior to applying the decoding mapping. In another implementation, the transformation mapping is unaware of (e.g., independent of) any gray mapping in the memory (e.g., the NAND memory). In this implementation the transformation mapping uses a set of n-tuples which are a subset of the $2^n$ possible n-tuples. This subset is used by the memory (e.g., the NAND memory) to represent states which are programmed to lower voltage regions.

Thus, the systems, devices, and methods of the present disclosure may reduce wear to the memory (and increase longevity of the memory) by storing shaped data (e.g., the transformed data) as compared to systems that store unshaped parity data. Additionally, the systems, devices, and methods of the present disclosure may enable compensation for one or more bit errors during decoding (e.g., de-shaping) of transformed data representations read from the memory. The techniques described herein may be less complex and less expensive to implement than systems that shift the location of unshaped parity data with respect to shaped data prior to storing the shaped data and the unshaped parity data to a memory. Additionally, at least some of the techniques described herein may shape user data without increasing the size of the user data.

FIG. 1 illustrates a system 100 that includes an access device 150 and a data storage device 102. The access device 150 is coupled to the data storage device 102 via a communication path 126. The communication path 126 may be a bus or a wireless connection, as non-limiting examples. The data storage device 102 may include an access interface 124 that enables communication via the communication path 126, such as when the access interface 124 is communicatively coupled to the access device 150.

The data storage device 102 includes a memory 104 and a controller 120. The memory 104 may store data in multiple regions, such as a group of storage elements 106. In a particular example, the group of storage elements 106 may be a word line, a block, a page, a zone, a plane, a die, or another region of the memory 104. The group of storage elements 106 may include one or more storage elements configured to store data. The one or more storage elements may store multi-level cell (MLC) data or single-level cell (SLC) data. SLC data may be stored as a single bit per storage element, and MLC data may be stored as multiple bits per storage element. The controller 120 is coupled to the memory 104 via a bus 110, an interface (e.g., interface circuitry, such as a memory interface 122), another structure, or a combination thereof. The controller 120 and the memory 104 may exchange information via the bus 110, the memory interface 122, or a combination thereof. For example, one or more of write data, read data, and other data or instructions may be exchanged between the controller 120 and the memory 104 via the bus 110, the memory interface 122, or a combination thereof. In some implementations, the memory 104 may include an interface configured to enable communications between the controller 120 and the memory 104 via the bus 110.

The controller 120 includes a controller memory 160, a data shaping engine 162, and an error correction code (ECC) engine 164. In some implementations, the controller 120 may optionally include a data compression engine 166. The controller memory 160 may be a memory device, such as a random access memory (RAM) or other volatile memory, that is configured to store instructions or data used by the controller 120 during performance of one or more operations. In some implementations, data illustrated as being stored at other components (e.g., the data shaping engine 162, the ECC engine 164, the data compression engine 166, or a combination thereof) may be stored at the controller memory 160 and may be accessible to the other components.

The data shaping engine 162 is configured to apply a mapping to input data to generate transformed data (e.g., shaped data) as further described herein. The mapping may be selected from a plurality of mappings 175. In a particular implementation, the plurality of mappings 175 may be stored at the controller memory 160. Alternatively, the plurality of mappings 175 may be stored at the data shaping engine 162. The data compression engine 166, when included in the controller 120, may be used to compress data, such as user data, prior to providing compressed data to the ECC engine 164, as further described herein. For example, the data compression engine 166 may be configured to compress user data 152 prior to providing a compressed version of the user data 152 (compressed user data 170) to the data shaping engine 162 or to the ECC engine 164. Thus, data may be compressed prior to ECC encoding. Compression of data prior to applying a mapping 174 at the data shaping engine 162 is described in further detail with reference to FIG. 6. Additionally, the data compression engine 166 may be configured to decompress a representation of read data from the memory 104 after de-shaping and ECC decoding to generate output data 154.

The ECC engine 164 is configured to generate one or more ECC code words, such as an ECC codeword 172. The ECC engine 164 generates the ECC codeword 172 based on user data, such as the compressed user data 170 (or the user data 152 if the data compression engine 166 is omitted). The ECC codeword 172 may have one or more m-tuples of bits. The ECC engine 164 provides the ECC codeword 172 to the data shaping engine 162, and the ECC codeword 172 may be received by the data shaping engine 162 as a sequence of input data. Thus, the compressed user data 170 may be converted (e.g., encoded) into the ECC codeword 172 that is provided to the data shaping engine 162 as input data, and the data shaping engine 162 may shape such input data to generate transformed data 176 by applying a mapping to the input data.

In various implementations, the data shaping engine 162 is configured to receive input data from various sources. In some implementations, the user data 152 is provided to the data shaping engine 162 as the input data (e.g., compression and ECC processing of the user data 152 are omitted). In some implementations, the user data 152 is provided to the ECC engine 164, encoded, and then provided to the data shaping engine 162 (e.g., as the ECC codeword 172). In some implementations, the user data 152 is provided to the data compression engine 166, compressed, and then provided to the data shaping engine 162 (or to the ECC engine 164 for ECC encoding prior to being provided as input data to the data shaping engine 162). In a particular implementation, the user data 152 is provided to the data compression engine 166, and the data compression engine 166 compresses the user data 152 to generate the compressed user data 170. The ECC engine 164 performs ECC processing on the compressed user data 170 to generate the ECC codeword 172, and the data shaping engine 162 shapes the ECC codeword 172 to generate the transformed data 176. As further described herein, the transformed data 176 is shaped (e.g., has fewer logical "0" values than the ECC codeword 172) and the transformed data 176 is the same size as the user data 152. In an alternate implementation, the ECC engine 164 and the data shaping engine 162 are replaced with a single shaping and ECC engine that performs data shaping and ECC processing, as further described with reference to FIG. 2.

The data shaping engine 162 is configured to encode the input data to generate the transformed data 176. The data shaping engine 162 may apply a mapping to the input data to generate transformed data. For example, the data shaping engine 162 may apply a mapping 174 to the input data. To illustrate, the data shaping engine 162 may receive the input data (e.g., the user data 152, the ECC codeword 172, or the compressed user data 170), identify a first m-tuple of the input data, and map (by applying the mapping 174) the first m-tuple to a first n-tuple, where n and m are positive integers, and n is greater than m. Additional m-tuples of the input data may be processed by the data shaping engine 162 to generate the transformed data 176. Thus, the data shaping engine 162 is configured to apply the mapping 174 to m-tuples of the input data to generate n-tuples of the transformed data 176.

The mapping 174 may indicate a relationship of a gray coding of m-tuples to a gray coding of n-tuples. For example, a group of m-tuples to be mapped by the mapping 174 may be arranged in a gray coding (e.g., the group of m-tuples may be arranged in an order in which two successive m-tuples differ by a single bit), a group of n-tuples representing the transformed data 176 may be arranged in a gray coding (e.g., the group of n-tuples may be arranged in an order in which two consecutive n-tuples differ by a single bit), and the group of m-tuples may be assigned (e.g., mapped) one-to-one to the group of n-tuples. In a particular implementation, the group of m-tuples includes all possible tuples of length m, and the group of n-tuples includes all possible tuples of length n. In other implementations, the group of m-tuples includes $2^m$ m-tuples (e.g., all possible tuples of length m) and the group of n-tuples includes a subset of $2^n$ n-tuples (e.g., a subset of all possible tuples of length n). Thus, in some implementations, the group of n-tuples indicated by the mapping 174 does not include all possible n-tuples. In case the data is not uniformly random, the mapping may be generated to favor mapping of sequences that includes certain m-tuples which appear with higher frequency (e.g., probability) in the input data into n-tuples which correspond to states in the memory 104 (mapped by the gray coding of the memory 104 (e.g., a NAND memory)) that are programmed to lower voltage regions. In an alternate implementation, the group of m-tuples includes fewer than all possible tuples of length m (e.g., a subset of m-tuples that occur in the input data, as one example), and the group of n-tuples includes fewer than all possible tuples of length n (e.g., a subset of n-tuples that have the fewest number of bits having the particular logical state, as one example). Each m-tuple of the group of m-tuples is mapped to one of the n-tuples of the group of n-tuples by the mapping 174. In a particular implementation, the mapping 174 includes a one-to-one encoding mapping of multiple m-tuples to multiple n-tuples (e.g., as described above) and a many-to-one decoding mapping of multiple n-tuples to multiple m tuples (e.g., a reverse mapping based on the one-to-one encoding mapping). The many-to-one decoding mapping may be used by the data shaping engine 162 to de-shape a representation of read data from the memory 104, as further described herein. Additionally or alternatively, the mapping 174 may include a one-to-one encoding mapping and a one-to-one decoding mapping. Alternatively, the mapping 174 may be a single mapping that is used for encoding and for decoding.

The transformed data 176 may satisfy one or more conditions regarding amounts of logical "0" values as compared to logical "1" values. In a particular implementation, the transformed data 176 may have fewer logical "0" values than the input data. Shaping may be performed to reduce the number of logical "0" values when the logical "0" value is associated with a high threshold voltage of storage elements. In other implementations, the number of logical "1" values may be reduced if logical "1" values are associated with a high threshold value of storage elements. In a particular implementation, the input data includes a first number of bit values that represent a particular logical state (e.g., a logical "0" value or a particular multi-bit value), and the transformed data 176 includes a second number of bit values that represent the particular logical state. In a particular implementation, the bit values may be single-bit values (e.g., a logical "1" value or a logical "0" value). In other implementations, the bit values may be multi-bit values, and the memory 104 may include storage elements configured to store voltages representing multi-bit values. The transformed data 176 has fewer bit values that represent the particular logical state than input data (e.g., the second number of bit values representing the particular logical state is less than the first number of bit values representing the particular logical state). For example, the input data may have an equal number of logical "1" values and logical "0" values, whereas the transformed data 176 may have more logical "1" values and fewer logical "0" values. In a particular example, the transformed data 176 may have approximately 70% logical "1" values and approximately 30% logical "0" values. Such transformed data having a greater number of logical "1" values as compared to logical "0" values may reduce wear on the storage elements of the memory 104 as compared to storing approximately 50% logical "1" values and approximately 50% logical "0" values. Thus, longevity of the memory 104 may be increased by storing the transformed data 176 instead of the input data. As another example, the input data may have an equal number of a first multi-bit value and a second multi-bit value, whereas the transformed data 176 may have more of the first multi-bit value and fewer of the second multi-bit value. Storing the first multi-bit value at a multi-level memory cell may reduce wear as compared to storing the second multi-bit value. Although each n-tuple is larger than each m-tuple (e.g., n is greater than m), in some implementations the transformed data 176 is the same size as the user data 152. To illustrate, the user data 152 is compressed prior to being shaped, and the compression compensates for the increase in size associated with the shaping. In other implementations, the transformed data 176 is larger than the user data 152 to further reduce the number of logical "0" values or to provide additional error compensation capability, as further described with reference to FIG. 2.

The transformed data 176 may be generated by the data shaping engine 162 applying the mapping 174 to the input data. In a particular implementation, the mapping 174 may be pre-determined in the data shaping engine 162 (e.g., as one of the plurality of mappings 175). In other implementations, the mapping 174 may be generated (or selected) based on the input data. As one example, the mapping 174 may be determined such that the transformed data 176 has a particular percentage of logical "0" values and logical "1" values (based on a target shaping level). In this example, the value of n may be determined such that the transformed data 176 is able to meet the target shaping level. To illustrate, as the shaping level increases, the value of n may increase such that the number of logical "1" values in each n-tuple increases. As a particular example, the input data may include four-bit tuples (e.g., m equals four), and the plurality of mappings 175 may include a four-bit tuple to six-bit tuple mapping associated with 40% logical "0" values, a four-bit tuple to eight-bit tuple mapping associated with a 30% logical "0" values, and a four-bit tuple to sixteen-bit tuple mapping associated with 20% logical "0" values. Based on a target shaping level, a size of the user data 152 prior to compression, or both, the data shaping engine 162 may select a particular mapping of the plurality of mappings 175 to use as the mapping 174. In a particular implementation, the data shaping engine 162 is further configured to select the mapping 174 from the plurality of mappings 175, where the mapping 174 reduces the number of bit values that represent the particular logical state in the transformed data 176 as compared to other mappings of the plurality of mappings 175. The controller 120 may be configured to store a key 178 associated with the mapping 174 in the memory 104, and the key 178 may be ECC processed prior to storage, as further described herein. Information used to track the shaping level associated with the transformed data 176, such as the percentage of bits having the particular value, may be stored in the controller memory 160. In another example, the mapping 174 may be determined based on n being a particular value (e.g., based on the transformed data 176 having a target size). In this example, the shaping level provided by the mapping 174 may be based on the difference between m and n (e.g., a larger difference between m and n may be associated with a higher shaping level). Numerical values (or indicators) of m and n may be stored in the controller memory 160 as metadata.

The controller 120 is further configured to store the transformed data 176 at the memory 104. For example, the controller 120 may communicate the transformed data 176 via the memory interface 122 and the bus 110 to the memory 104. For example, the controller 120 may issue a write operation to cause the transformed data 176 to be written (via the memory interface 122 and the bus 110) to a portion of the memory 104, such as the group of storage elements 106 (e.g., a word line, page, block, zone, or other grouping of storage elements) illustrated in FIG. 1.

The data shaping engine 162 is also configured to decode a transformed data representation read from the memory 104 to generate output data (corresponding to the input data). The data shaping engine 162 is configured to apply the decoding mapping (e.g., a reverse mapping based on the encoding mapping) to the transformed data representation to generate the output data (e.g., de-shaped data). To illustrate, the controller 120 is configured to initiate a read operation (e.g., based on a read command from the access device 150) to the memory 104 to read a transformed data representation, such as received data 180. The received data 180 may match the transformed data 176 or may differ from the transformed data 176 due to one or more bit errors. The data shaping engine 162 is configured to decode (e.g., de-shape) the received data 180 to generate output data, such as de-shaped data 182. To illustrate, the data shaping engine 162 may identify a first n-tuple of the received data 180 and may map (using the mapping 174) the first n-tuple to a first m-tuple of the de-shaped data 182. The data shaping engine 162 may be configured to map the first n-tuple to the first m-tuple when the first n-tuple is included in the mapping 174 (e.g., when the first n-tuple is included in the group of n-tuples that are mapped to m-tuples in the mapping 174).

The data shaping engine 162 may also be configured to select a particular n-tuple from the multiple n-tuples of the decoding mapping (e.g., the mapping 174) based on a difference between the first n-tuple and the particular n-tuple when the first n-tuple is not included in the mapping 174. For example, the data shaping engine 162 may select the particular n-tuple that reduces or minimizes the difference between the first n-tuple and the particular n-tuple, as compared to differences between the first n-tuple and other n-tuples of the mapping 174. In a particular implementation, the difference may include or correspond to a Hamming distance. To illustrate, when the first n-tuple is not included in the mapping 174, the data shaping engine 162 may select a particular n-tuple from the group of n-tuples, the particular n-tuple having the smallest Hamming distance between the first n-tuple and the particular n-tuple as compared to other n-tuples in the group of n-tuples. In other implementations, the difference may correspond to a Damerau-Levenshtein distance, a Jaccard index, or other measurements of differences between data or strings.

The data shaping engine 162 may be configured to decode the first n-tuple into the m-tuple that corresponds to the particular n-tuple in the mapping 174. Because an n-tuple that does not appear in the mapping 174 may be decoded as the n-tuple in the mapping 174 having the least difference with the n-tuple, the data shaping engine 162 may compensate for bit errors in the received data 180. For example, one or more bit errors may cause an n-tuple of the received data 180 to be different than the n-tuples in the mapping 174, and by decoding an error-containing n-tuple as an n-tuple that has the least difference (e.g., Hamming distance) with the error-containing n-tuple, the error-containing n-tuple may be decoded into an m-tuple using the mapping 174 instead of causing an uncorrectable error. Alternatively, if the first n-tuple is not included in the mapping 174, the data shaping engine 162 may generate an error. A second n-tuple of the received data 180 may be similarly mapped to a second m-tuple of the de-shaped data 182. In this manner, the received data 180 (e.g., the transformed data representation) may be mapped to the de-shaped data 182. When the errors are not propagating and only affect one n-tuple, the errors may be corrected by the ECC engine 164.

As a particular example of operation of the system 100, the user data 152 may be compressed by the data compression engine 166, and the compressed user data 170 may be provided to the ECC engine 164. The ECC engine 164 may generate the ECC codeword 172, which in some implementations may include uniform random data based on the compression algorithm applied by the data compression engine 166. In this example, the user data 152 is four kilobytes (KB), the compressed user data 170 is two KB, and the mapping 174 maps four-bit tuples (e.g., m-tuples) to eight-bit tuples (e.g., n-tuples). Because the mapping increases each m-tuple by four bits, the transformed data 176 is four KB, which is the same size as the user data 152.

In the particular example, the mapping 174 maps each four-bit tuple of a group of sixteen four-bit tuples into one eight-bit tuple of a group of sixteen eight-bit tuples. The group of sixteen eight-bit tuples includes the sixteen eight-bit tuples having the largest numbers of bits having a logical "1" value. To illustrate, the group of sixteen eight-bit tuples includes: 11111111, 11111110, 11111101, 11111011, 11110111, 11101111, 11011111, 10111111, 01111111, 11111100, 11111001, 11110011, 11100111, 11001111, 10011111, and 00111111. The mapping 174 indicates a relationship of a gray coding of the sixteen four-bit tuples to a gray coding of the sixteen eight-bit tuples. For example, the mapping 174 may map (e.g., assign) each four-bit tuple (e.g., m-tuple) of the gray coding of four-bit tuples to an eight-bit tuple (e.g., an n-tuple) of the gray coding of eight bit tuples. A particular example of the mapping 174 is shown in Table 1.

TABLE 1

| Input m-tuple | Output n-tuple |
|---|---|
| 0000 | 11111111 |
| 0001 | 11111110 |
| 0011 | 11111100 |
| 0010 | 11111101 |
| 0110 | 11111001 |
| 0111 | 11111011 |
| 0101 | 11110011 |
| 0100 | 11110111 |
| 1000 | 11100111 |
| 1001 | 11101111 |
| 1011 | 11001111 |
| 1010 | 11011111 |
| 1110 | 10011111 |
| 1111 | 10111111 |
| 1101 | 00111111 |
| 1100 | 01111111 |

After the mapping 174 (e.g., the one-to-one mapping of m-tuples to n-tuples illustrated in Table 1) is applied to the ECC codeword 172 to generate the transformed data 176, the transformed data 176 is written to the memory 104. When a representation of read data (e.g., the received data 180) is read from the memory 104, there may be one or more errors. The mapping 174 (e.g., the one-to-one reverse mapping of n-tuples to m-tuples illustrated in Table 1) is applied to the received data 180 to generate the de-shaped data 182. The de-shaping process may also cause one or more errors in the de-shaped data 182. The de-shaped data 182 is provided to the ECC engine 164 to correct the one or more errors through ECC processing based on ECC parity allocated before shaping. In general, an amount of ECC parity allocated before shaping is applied depends on the amount of noise in the channel (e.g., between the controller 120 and the memory 104), denoted as 'q,' and a shaping error amplification, denoted as 'p.' A selected ECC scheme accommodates a total error rate (e.g., a bit error rate (BER)) that is defined by the equation BER=q×p. The ECC engine 164 may be configured to perform ECC processing (e.g., to generate the ECC codeword 172) in accordance with the BER (e.g., a target BER value). For example, a level of ECC encoding, or an amount of ECC redundancy, provided by the ECC engine 164 may be determined based on the target BER value.

De-shaping the received data 180 may compensate for one or more bit errors. For example, if a first eight-bit tuple (e.g., an n-tuple) of the received data 180 has a single error, the data shaping engine 162 searches the sixteen eight-bit tuples in the mapping 174 for a particular eight-bit tuple having the least Hamming distance to the first eight-bit tuple (e.g., a particular eight-bit tuple that is the least different from the first eight-bit tuple), and the data shaping engine 162 de-shapes the first eight-bit tuple to a four-bit tuple corresponding to the particular eight-bit tuple in the mapping 174. To illustrate, if 10111110 is read from the memory 104, the data shaping engine 162 may determine that 10111110 has the smallest Hamming distance to 11111110, and accordingly the data shaping engine 162 may de-shape the eight-bit tuple 10111110 to the four bit tuple 0001 (which is mapped to the eight-bit tuple 11111110 in the mapping 174). After the de-shaped data 182 is generated, the de-shaped data 182 is provided to the ECC engine 164 for generation of the error-corrected data 184, and the error-corrected data 184 is de-compressed by the data compression engine 166 to generate the output data 154. In this example, the received data 180 is four KB, the error-corrected data 184 and the de-shaped data are two KB, and the output data 154 is four KB (decompressed from the two KB error-corrected data 184 decoded by the ECC engine 164). Thus, shaped data having the same size (e.g., four KB) as the user data 152 can be stored to the memory 104 to reduce wear to the memory 104 without using additional storage space.

During operation, the controller 120 is configured to receive the user data 152 from the access device 150. In some implementations, the data compression engine 166 compresses the user data 152 to generate the compressed user data 170. In some implementations, the user data 152 (or the compressed user data 170) is provided to the ECC engine 164 for ECC processing to generate the ECC codeword 172. The data shaping engine 162 receives input data (e.g., the user data 152, the compressed user data 170, or the ECC codeword 172) having a first number of m-tuples and generates the transformed data 176 having a second number of n-tuples. The first number is the same as the second number. The data shaping engine 162 applies the mapping 174 to the input data to generate the transformed data 176. For example, the data shaping engine 162 maps each m-tuple of the input data to a corresponding n-tuple, and the data shaping engine 162 selects one n-tuple of each group of n-tuples for inclusion in the transformed data 176. The controller 120 may cause the transformed data 176 to be stored at the memory 104, such as at the group of storage elements 106, by initiating a write operation at the memory 104.

Additionally, the controller 120 may read a transformed data representation from the memory 104. For example, the controller 120 may issue a read command at the memory 104 in response to a read request from the access device 150. The read command typically includes an address of a particular region of the memory (e.g., the group of storage elements 106) which stores data. In response to issuing the read command, the received data 180 (e.g., a transformed data representation that may have one or more bit errors) is provided from the memory 104 to the controller 120. The received data 180 has one or more n-tuples. The controller 120 provides the received data 180 to the data shaping engine 162. The data shaping engine 162 decodes (e.g., de-shapes) the received data 180 to generate the de-shaped data 182. To illustrate, the data shaping engine 162 identifies a first n-tuple of the received data 180 and maps the first n-tuple to a first m-tuple according to the mapping 174 (e.g., the decoding mapping). The first m-tuple is included in the de-shaped data 182. The data shaping engine 162 may decode the remaining received data 180 in a similar manner to generate the de-shaped data 182.

The de-shaped data 182 may be provided to the ECC engine 164 for ECC decode processing. For example, the de-shaped data 182 may represent one or more representations of ECC codewords, and the ECC engine 164 may process the one or more representations of ECC codewords to generate error-corrected data 184. The error-corrected data 184 may be provided from the ECC engine 164 to the data compression engine 166 for decompression. The data compression engine 166 may decompress the error-corrected data 184 to generate output data 154, which is provided to the access device 150. In other implementations, the de-shaped data 182 or the error-corrected data 184 can serve as the output data 154.

In a particular implementation, determining the mapping 174 includes sorting $2^m$ m-tuples of the input data according to a frequency of each m-tuple in the input data and assigning an output n-tuple to each m-tuple of the sorted m-tuples at least partially based on a number of bit values in each output n-tuple that represent the particular logical state. For example, an m-tuple having the highest frequency may be mapped to an output n-tuple having the fewest logical "0" values.

In a particular implementation, the mapping 174 may be a "static" (e.g., fixed) mapping. A mapping is referred to as a static mapping if the mapping remains the same during processing of an entirety of the input data. Alternatively, a mapping is referred to as "adaptive" if the mapping is modified (e.g., updated) one or more times during processing of the input data. When a static mapping is used, the entirety of the input data is processed prior to determining the mapping 174. For example, the entirety of input data is processed, and m-tuples are sorted as described above to determine the mapping 174. Additionally, when the mapping is a static mapping, the data shaping engine 162 may be configured to generate a key 178 that identifies the mapping 174, and the key 178 may be stored at the memory 104. In some implementations, the key 178 includes a mapping table of the mapping 174 (e.g., a mapping table that indicates a mapping of each m-tuple to each of n-tuple). In some implementations, the key 178 may be ECC processed prior to storage at the memory 104. When a transformed data representation is read from the memory 104, the key 178 may be read from the memory 104, ECC processing may be performed on the key 178, and the processed key 178 may be provided to the data shaping engine 162 for use in decoding the transformed data representation. Static mappings are described in further detail with reference to FIG. 4.

In an alternate implementation, the mapping 174 may be an adaptive mapping. In this implementation, the mapping 174 may be determined and modified (e.g., updated) based on portions of the input data as the portions are processed. For example, a first portion of the input data may be processed and the mapping 174 may be determined such that each n-tuple of a first portion of the transformed data 176 meets a target shaping level or a target size of the transformed data 176. After the first portion of the input data is processed, a second portion of the input data is processed, and the mapping 174 is updated based on a distribution of m-tuples in the first portion of the input data and based on the previous mapping. Thus, the mapping 174 for a particular portion of the input data may therefore be a function of a previous portion of the input data. Adaptive mappings are described in further detail with reference to FIG. 5.

In some implementations of adaptive mappings, distributions of m-tuples of more recently processed portions may have a higher weight than distributions of m-tuples of less recently processed portions. In this manner, the adaptive mapping may adapt to patterns in portions of the input data. Because the mapping 174 may be updated multiple times during processing of the input data, no single mapping table is used to generate the transformed data 176 in an adaptive mapping implementation. Thus, a mapping table (e.g., the key 178) is not stored in the memory 104 when the mapping is an adaptive mapping.

To decode the received data 180 using an adaptive mapping, the data shaping engine 162 may be configured to perform a reverse adaptive mapping. For example, the data shaping engine 162 may de-shape a first portion of the received data 180 to generate a first portion of the de-shaped data 182. The first portion of the de-shaped data 182 may be decoded based on one or more rules, settings, or other information associated with the mapping 174. After processing the first portion of the received data 180, a second portion of the received data 180 may be received and the reverse adaptive mapping may be updated. The updated reverse mapping (from the first portion of the received data 180) may be used to process the second portion of the received data 180 to generate the second portion of the de-shaped data 182. Thus, the reverse adaptive mapping may be updated as each portion of the received data 180 is processed (e.g., de-shaped) to generate m-tuples of the next de-shaped data 182. In some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a mini SD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

In some implementations, the data storage device 102 and the access device 150 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples. The one or more protocols may include a standardized protocol and/or a non-standardized protocol, such as a proprietary protocol. In some implementations, the data storage device 102 and the access device 150 may be configured to communicate using dual channel communication (e.g., both devices may issue and receive commands from the other device).

The access device 150 may include a memory interface (not shown) and may be configured to communicate with the data storage device 102 via the memory interface to read data from and write data to a memory 104 of the data storage device 102. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the memory 104 in accordance with any other suitable communication protocol.

The access device 150 may include a processor and a memory. The memory may be configured to store data and/or instructions that are executable by the processor. The memory may be a single memory or may include multiple memories, such as one or more non-volatile memories, one or more volatile memories, or a combination thereof. The access device 150 may issue one or more commands to the data storage device 102, such as one or more requests to erase data, read data from, or write data to the data storage device 102. For example, the access device 150 may be configured to provide data to be stored at the data storage device 102 or to request data to be read from the data storage device 102. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

In a particular implementation, the ECC engine 164 may be configured to perform ECC processing on input data, such as the user data 152 received by the controller 120 from the access device 150, to generate one or more ECC codewords. For example, the ECC engine 164 may process the input data using an ECC encoding technique, such as a Reed-Solomon encoding technique, a Bose-Chaudhuri-Hocquenghem (BCH) encoding technique, a low-density parity check (LDPC) encoding technique, a turbo encoding technique, one or more other ECC encoding techniques, or a combination thereof, as illustrative, non-limiting examples. To illustrate, the ECC engine 164 may be configured to process the user data 152 to generate the ECC codeword 172.

The ECC engine 164 may also be configured to receive data, such as one or more ECC codewords, from the memory 104 and to process the received data based on one or more ECC decoding techniques to generate output data. The decoded output data may be provided to the access device 150, for example in response to a read command from the access device 150. In some implementations, the ECC engine 164 may include an encoder configured to generate ECC codewords based on input data and a decoder configured to generate output data based on received ECC codewords. In other implementations, the ECC engine 164 includes a single component configured to perform the operations of the encoder and the decoder.

One aspect of the transformation mapping (e.g., the mapping 174) is to reduce as much as possible the error enhancement when de-shaping is done before ECC decoding as to avoid excess ECC parity which reduces the user capacity or reduces the endurance gain (e.g., wear reduction) when using the transformation mapping. A manner to achieve this goal is to have the transformation mapping maintain the gray rule (e.g., a gray coding) such that, when mapping an m-tuple to an n-tuple, "neighbors" of the m-tuple are mapped to "neighbors" of the n-tuple. A "neighbor" to a tuple is defined as a tuple with a Hamming distance of one from the tuple. Thus, if there is a single error in the n-tuple, there is also a single error in the m-tuple and thus the number of errors is not increased by the transformation mapping (e.g., the mapping 174). In some implementations where n>m, it might not be possible to hold the above rule (e.g., to maintain the number of errors after transforming a tuple) for all tuples and all their neighbors. In such implementations, the transformation mapping may be determined such that transforming tuples minimizes (or reduces) the number of errors introduced by the transformation mapping.

In a particular implementation, the data compression engine 166 is configured to compress the user data 152 in accordance with a data throughput setting. For example, a data throughput setting of the system 100 may indicate a maximum size of data that may be processed, and the data compression engine 166 may compress the user data 152 to a size that does not exceed the maximum size. The ECC engine 164 may be configured to generate the ECC codeword 172 in accordance with a bit error rate setting. For example, as explained above, the ECC engine 164 may process the compressed user data 170 (or the user data 152) based on a target BER value. The target BER value may be given by the equation BER=q×p, as described above. Additionally, the data shaping engine 162 may be configured to generate the transformed data 176 having the same size as the user data 152 prior to compression. For example, if the user data 152 is four KB, the transformed data 176 is also four KB.

In a particular implementation, the controller 120 may include an encryption engine. The encryption engine may be configured to encrypt data in accordance with one or more encryption schemes. The encryption engine may be further configured to decrypt data in accordance with the one or more encryption schemes. Alternatively, the controller 120 may include a decryption engine that is separate from the encryption engine. The encryption engine may enable the controller 120 to provide additional security to data stored at the memory 104 in some implementations. To illustrate, in a particular implementation, the encryption engine may encrypt the compressed user data 170 after generation by the data compression engine 166 (based on the user data 152). The data shaping engine 162 may generate shaped data based on the encrypted data generated by the encryption engine, and the ECC engine 164 may perform ECC processing on the shaped data to generate the transformed data 176 for storage at the memory 104. When data is read from the memory 104, the ECC engine 164 may perform ECC processing (e.g., decoding) on the received data 180 to generate error corrected data. The data shaping engine 162 may generate de-shaped data based on the error corrected data, and the encryption engine (or a separate decryption engine) may generate decrypted data based on the de-shaped data. The data compression engine 166 may generate decompressed data (e.g., the output data 154) based on the decrypted data. The decompressed data may be a representation of user data stored at the memory 104 (e.g., after compression, encryption, shaping, and ECC processing). Inclusion of the encryption engine may increase security of the transformed data 176 stored at the memory 104.

In a particular implementation, shaping may be performed before ECC processing. To illustrate, the controller 120 may be configured to receive a portion of input data (e.g., a portion of the user data 152). The data compression engine 166 may compress the portion of the input data to generate a portion of the compressed user data 170. The controller 120 (e.g., an encryption engine included in the controller 120) may encrypt the portion of the compressed user data 170 to generate encrypted data. The controller 120 (e.g., the data shaping engine 162) may apply the mapping 174 to the encrypted data to generate shaped data that is substantially the same size as the portion of the input data. The controller 120 (e.g., the ECC engine 164) may perform ECC processing on the shaped data to generate encoded data and parity data. The controller 120 may "rotate" the parity data with respect to the encoded data to generate second transformed data, and the second transformed data may be written to the memory 104. Rotating the parity data with respect to the encoded data shifts a position of the parity data with respect to the encoded data such that the parity data (e.g., data having a substantially equal number of a first bit value and a second bit value) is written to different memory elements during different write operations.

The data storage device 102 of FIG. 1 may generate the transformed data 176 and store the transformed data 176 at the memory 104. Because the transformed data 176 is shaped data (e.g., data having fewer logical "0" values and more logical "1" values than the user data 152), storing the transformed data 176 at the memory 104 may reduce wear to the memory 104 as compared to storing data having approximately equal percentages of logical "0" values and logical "1" values (such as un-shaped parity data). Additionally, the second mapping (used to decode a transformed data representation) may account for (e.g., render inconsequential) one or more bit errors in the transformed data representation. Thus, the controller 120 increases longevity of the memory 104 and enables compensation for one or more bit errors during decoding (e.g., de-shaping) of data, as compared to systems that store unshaped parity data at a memory and that include additional components to shift a location of the unshaped parity data during different write cycles.

Figure 2:
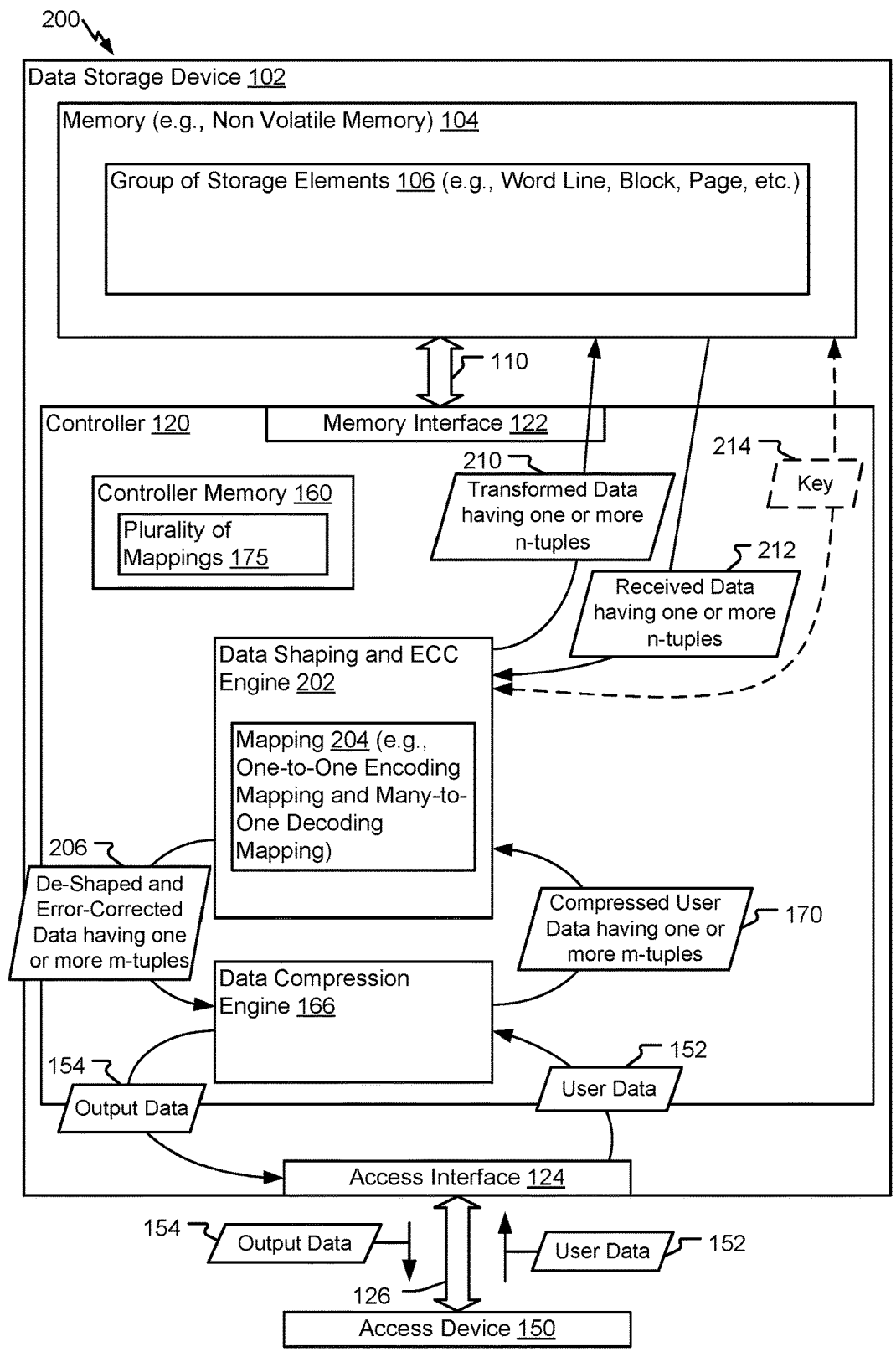
FIG. 2 is a block diagram of a second illustrative example of a system including a device configured to apply a mapping to input data to generate transformed data (e.g., shaped data)

Referring to FIG. 2, a second example of a system including a device configured to apply a mapping to input data to generate transformed data (e.g., shaped data) is shown and generally designated 200. The system 200 includes the data storage device 102 and the access device 150. The access device 150 is described with reference to FIG. 1. The data storage device 102 includes the memory 104, and the controller 120 includes the controller memory 160 and the data compression engine 166, as described with reference to FIG. 1.

The controller 120 of FIG. 2 includes a data shaping and ECC engine 202. The data shaping and ECC engine 202 takes the place of the data shaping engine 162 and the ECC engine 164 of FIG. 1. The data shaping and ECC engine 202 may be configured to perform data shaping and ECC processing on input data to generate transformed data 210 for storage at the memory 104. For example, the data shaping and ECC engine 202 may receive the compressed user data 170 from the data compression engine 166 and may perform data shaping and ECC processing on the compressed user data 170 to generate the transformed data 210. Additionally, the data shaping and ECC engine 202 may be configured to jointly perform de-shaping and ECC decoding on received data 212 to generate de-shaped and error-corrected data 206.

The data shaping and ECC engine 202 is configured to apply a mapping to input data to generate transformed data (e.g., shaped data). For example, the data shaping and ECC engine 202 may apply a mapping 204 to the compressed user data 170 to generate the transformed data 210. Applying the mapping 204 may perform ECC processing (e.g., addition of ECC parity) and shaping of the data in a single operation, as compared to separately performing ECC processing and then shaping data.

The mapping 204 may include a one-to-one encoding mapping and a many-to-one decoding mapping. For example, the one-to-one encoding mapping may be used to map each m-tuple of a plurality of m-tuples to a corresponding n-tuple of a plurality of n-tuples during an encoding (e.g., a shaping) process. The n-tuples include fewer bits having a particular logical state (e.g., a logical "0" value) than the m-tuples. Additionally, the many-to-one decoding mapping may be used to map each group of n-tuples of a plurality of n-tuples to a corresponding m-tuple of a plurality of m-tuples during a decoding (e.g., a de-shaping) process. For example, multiple n-tuples may be mapped to each m-tuple by the many-to-one decoding mapping of the mapping 204.

To illustrate, the data shaping and ECC engine 202 may receive the input data (e.g., the user data 152 or the compressed user data 170), identify a first m-tuple of the input data, and map (by applying the one-to-one encoding mapping of the mapping 204) the first m-tuple to a first n-tuple, where n and m are positive integers, and n is greater than m. The data shaping and ECC engine 202 may identify a second m-tuple of the input data and may map the second m-tuple to a second n-tuple by applying the one-to-one encoding mapping of the mapping 204. Additional m-tuples of the input data may be processed by the data shaping and ECC engine 202 to generate the transformed data 210. Thus, the data shaping and ECC engine 202 is configured to apply the mapping 204 to m-tuples of the input data to generate n-tuples of the transformed data 210. After the transformed data 210 is generated, the controller 120 may write the transformed data 210 to the memory 104.

The transformed data 210 may satisfy one or more conditions regarding amounts of logical "0" values as compared to logical "1" values, as described with reference to FIG. 1. As one example, the transformed data 210 may have fewer logical "0" values than the input data. In some implementations, the size of the transformed data 210 may be the same as the size of the user data 152. To illustrate, the data compression engine 166 may compress the user data 152 by an amount that compensates for the increase in data size caused by the data shaping and ECC processing performed by the data shaping and ECC engine 202. In another implementation, the data compression engine 166 may compress the user data 152 by an amount that compensates only for the data shaping performed by the data shaping and ECC engine 202. In other implementations, the transformed data 210 may be larger than the user data 152. For example, the transformed data 210 may have a higher shaping level (e.g., fewer bits having the particular logical state) or additional redundancy may be added to compensate for more bit errors, which causes a larger size increase during generation of the transformed data 210.

The data shaping and ECC engine 202 may also be configured to decode (e.g., de-shape) a transformed data representation read from the memory 104 to generate output data (corresponding to the input data). The data shaping and ECC engine 202 may be configured to apply the many-to-one decoding mapping of the mapping 204 to the transformed data representation to generate the output data (e.g., de-shaped data). To illustrate, the controller 120 is configured to initiate a read operation (e.g., based on a read command from the access device 150) to the memory 104 to read a transformed data representation, such as the received data 212. The received data 212 may match the transformed data 210 or may differ from the transformed data 210 due to one or more bit errors. The data shaping and ECC engine 202 may be configured to decode (e.g., de-shape) the received data 212 to generate output data, such as de-shaped and error-corrected data 206. To illustrate, the data shaping and ECC engine 202 may identify a first n-tuple of the received data 212 and may determine a group of n-tuples in the many-to-one decoding mapping that includes the first n-tuple. The first n-tuple of the received data 212 may be mapped (using the many-to-one decoding mapping of the mapping 204) to a first m-tuple of the de-shaped and error-corrected data 206. A second n-tuple of the received data 212 may be similarly mapped to a second m-tuple of the de-shaped and error-corrected data 206. In this manner, the received data 212 (e.g., the transformed data representation) may be mapped to the de-shaped and error-corrected data 206 while accounting for the one or more bit errors.

The many-to-one decoding mapping may be generated to increase (or maximize) the difference between n-tuples of different groups while increasing (or maximizing) the number of bit values having a logical "1" value (or a particular multi-bit value). In a particular implementation, the difference (e.g., the Hamming distance) between two n-tuples of different groups is at least three bits (e.g., at least three bits are different between two n-tuples from different groups). A particular example of a many-to-one decoding mapping that fits the above-described limitations is shown in Table 2. In the particular example shown in Table 2, the average number of logical "1" values in the input m-tuples is 50%, and the average number of logical "1" values in the output n-tuples is 71.875%.

TABLE 2

| Input m-tuples | Output n-tuples |
|---|---|
| 00 | 11111111; |
|  | 11111110; 11111101; 11111011; 11110111 |
|  | 11101111; 11011111; 10111111; 01111111 |
| 01 | 11111000; |
|  | 11111001; 11111010; 11111100; 11110000 |
|  | 11101000; 11011000; 10111000; 01111000 |
| 10 | 00011111; |
|  | 10011111; 01011111; 00111111; 00001111 |
|  | 00010111; 00011011; 00011101; 00011110 |
| 11 | 11100011; |
|  | 11100010; 11100001; 11100111; 11101011 |
|  | 11110011; 11000011; 10100011; 01100011 |

To illustrate the decoding process, the data shaping and ECC engine 202 may apply the many-to-one decoding mapping of the mapping 204 (shown in Table 2) to the received data 212 to generate the de-shaped and error-corrected data 206. For example, the data shaping and ECC engine 202 may identify the n-tuple "11111110" in the received data 212, and the data shaping and ECC engine 202 may map the n-tuple "11111110" to the m-tuple "00." In a particular implementation, the n-tuple "11111110" may be identified due to a bit error. To illustrate, during encoding the m-tuple "00" may be mapped to the n-tuple "11111111," which is included in the transformed data 210 that is stored in the memory 104. Due to a bit error, the n-tuple in the received data 212 may be "11111110" instead of "11111111." However, because the n-tuple "11111110" is included in the same group of n-tuples as the n-tuple "11111111," the n-tuple "11111110" is mapped to the m-tuple "00." Because n-tuples corresponding to bit errors (e.g., the n-tuple "11111110") are included in the groups of n-tuples, the de-shaped data (e.g., the m-tuple) may be generated without determining a difference between the first n-tuple (e.g., the n-tuple "11111110") and other n-tuples in the many-to-one decoding mapping of the mapping 204. By mapping a group of n-tuples (e.g., an encoded n-tuple and other n-tuples within a particular Hamming distance of the encoded n-tuple) to a single m-tuple, the mapping 204 (e.g., the many-to-one decoding mapping) enables the data shaping and ECC engine 202 to compensate for one or more bit errors.

In the particular many-to-one decoding mapping shown in Table 2, each group of n-tuples includes nine n-tuples. In other implementations, the groups of n-tuples may include more than nine n-tuples or fewer than nine n-tuples. In a particular implementation, each possible n-tuple (e.g., four n-tuples if n is four, eight n-tuples if n is eight, etc.) is mapped to an m-tuple in the many-to-one decoding mapping of the mapping 204.

During operation, the controller 120 is configured to receive the user data 152 from the access device 150. In some implementations, the data compression engine 166 compresses the user data 152 to generate the compressed user data 170. The data shaping and ECC engine 202 receives input data (e.g., the compressed user data 170 or the user data 152) having a first number of m-tuples and generates the transformed data 210 having a second number of n-tuples. The first number is the same as the second number. The data shaping and ECC engine 202 applies the mapping 204 (e.g., the one-to-one encoding mapping) to the input data (e.g., the compressed user data 170 or the user data 152) to generate the transformed data 210. For example, the data shaping and ECC engine 202 maps each m-tuple of the input data to a corresponding n-tuple of the transformed data 210. The controller 120 may cause the transformed data 210 to be stored at the memory 104, such as at the group of storage elements 106, by initiating a write operation at the memory 104.

Additionally, the controller 120 may read a transformed data representation from the memory 104. For example, the controller 120 may issue a read command at the memory 104 in response to a read request from the access device 150. The read command typically includes an address of a particular region of the memory (e.g., the group of storage elements 106) which stores data. In response to issuing the read command, the received data 212 (e.g., a transformed data representation that may have one or more bit errors) is provided from the memory 104 to the controller 120. The received data 212 has one or more n-tuples. The controller 120 provides the received data 212 to the data shaping and ECC engine 202. The data shaping and ECC engine 202 decodes (e.g., de-shapes) the received data 212 to generate the de-shaped and error-corrected data 206. To illustrate, the data shaping and ECC engine 202 identifies a first n-tuple of the received data 212 and determines a corresponding group of n-tuples using the mapping 204 (e.g., the many-to-one decoding mapping). After determining the corresponding group of n-tuples, the data shaping and ECC engine 202 maps the first n-tuple to a first m-tuple according to the many-to-one decoding mapping. The first m-tuple is included in the de-shaped and error-corrected data 206. The data shaping and ECC engine 202 may decode the remaining received data 212 in a similar manner to generate the de-shaped and error-corrected data 206.

The de-shaped and error-corrected data 206 may optionally be provided to the data compression engine 166. In some implementations, the data compression engine 166 may decompress the de-shaped and error-corrected data 206 to generate the output data 154. In other implementations, the de-shaped and error-corrected data 206 may be provided as an output to the access device 150.

To further illustrate operation at the data shaping and ECC engine 202, during generation of the transformed data 210, the data shaping and ECC engine 202 may map a first m-tuple of the input data to a first n-tuple. When decoding the received data 212, the data shaping and ECC engine 202 may identify a second n-tuple of the received data 212 as being included in a first group of n-tuples. The first group of n-tuples may include the first n-tuple and other n-tuples that are within a particular difference level (e.g., a Hamming distance). The second n-tuple may be identified (instead of the first n-tuple that was stored at the memory 104) due to a bit error. The data shaping and ECC engine 202 may determine that the second n-tuple belongs to the first group of n-tuples based on the mapping 204 (e.g., the many-to-one decoding mapping). The data shaping and ECC engine 202 may use the mapping 204 to map the second n-tuple to the first m-tuple, and the first m-tuple may be included in the de-shaped and error-corrected data 206. Thus, the mapping 204 (e.g., the many-to-one decoding mapping) may account for one or more bit errors in the received data 212.

The data shaping and ECC engine 202 may be configured to maintain a particular difference level between a first n-tuple and other n-tuples of each group of n-tuples. In a particular implementation, the difference level is a Hamming distance. The particular difference level may be based on a number of bits that are different or a position of the bits that are different. For example, the first group of n-tuples may be generated (e.g., selected) such that there is a particular number of different bits between the first n-tuple and the second n-tuple or the first n-tuple and the third n-tuple. In some implementations, the particular number may be one. For example, the first n-tuple may be 1111, the second n-tuple may be 1011, and the third n-tuple may be 1101. In other examples, the difference may be constrained to a particular bit. Because the n-tuples are selected to enable a difference level condition, if the first n-tuple has one or more bit errors but the number of bit errors is less than the group difference level, the erroneous n-tuple is also a member of the first group of n-tuples. To illustrate, if the n-tuple 1111 is written to the memory 104, a bit error may cause the received data 212 to instead include the n-tuple 1011. Because both n-tuples are part of the same group of n-tuples, the n-tuple 1011 is mapped to the corresponding m-tuple of the de-shaped data 182, and the bit error is compensated for (e.g., the bit error is accounted for by use of the second mapping). In a particular implementation, the groups of n-tuples, and n-tuples within the groups, are selected together with the mapping 204 (e.g., a NAND mapping) in a manner that n-tuples which have one bit position in difference correspond to adjacent states in the memory 104. As used herein, adjacent refers to having adjacent voltage regions allocated in a voltage window (e.g., a voltage distribution corresponding to states of storage elements) of the memory 104.

In a particular implementation, the mapping 204 may be a static mapping, as further described with reference to FIG. 4. When the mapping 204 is a static mapping, a key 214 may be generated and stored at the memory 104, and the key 214 may be read from the memory 104 and used to decode the received data 212. Alternatively, the mapping 204 may be an adaptive mapping, as further described with reference to FIG. 5. When the mapping 204 is an adaptive mapping, the key 214 is omitted.

The data storage device 102 of FIG. 2 may generate the transformed data 210 and store the transformed data 210 at the memory 104. Because the transformed data 210 is shaped data (e.g., data having fewer logical "0" values and more logical "1" values than the user data 152), storing the transformed data 210 at the memory 104 may reduce wear to the memory 104 as compared to storing data having approximately equal percentages of logical "0" values and logical "1" values (such as un-shaped parity data). Additionally, the many-to-one decoding mapping of the mapping 204 may account for (e.g., render inconsequential) one or more bit errors in the transformed data representation. Thus, the controller 120 of FIG. 2 (e.g., the data shaping and ECC engine 202) increases longevity of the memory 104 and enables compensation for one or more bit errors during decoding (e.g., de-shaping) of data, as compared to systems that store unshaped parity data at a memory and that include additional components to shift a location of the unshaped parity data during different write cycles.

Figure 3:
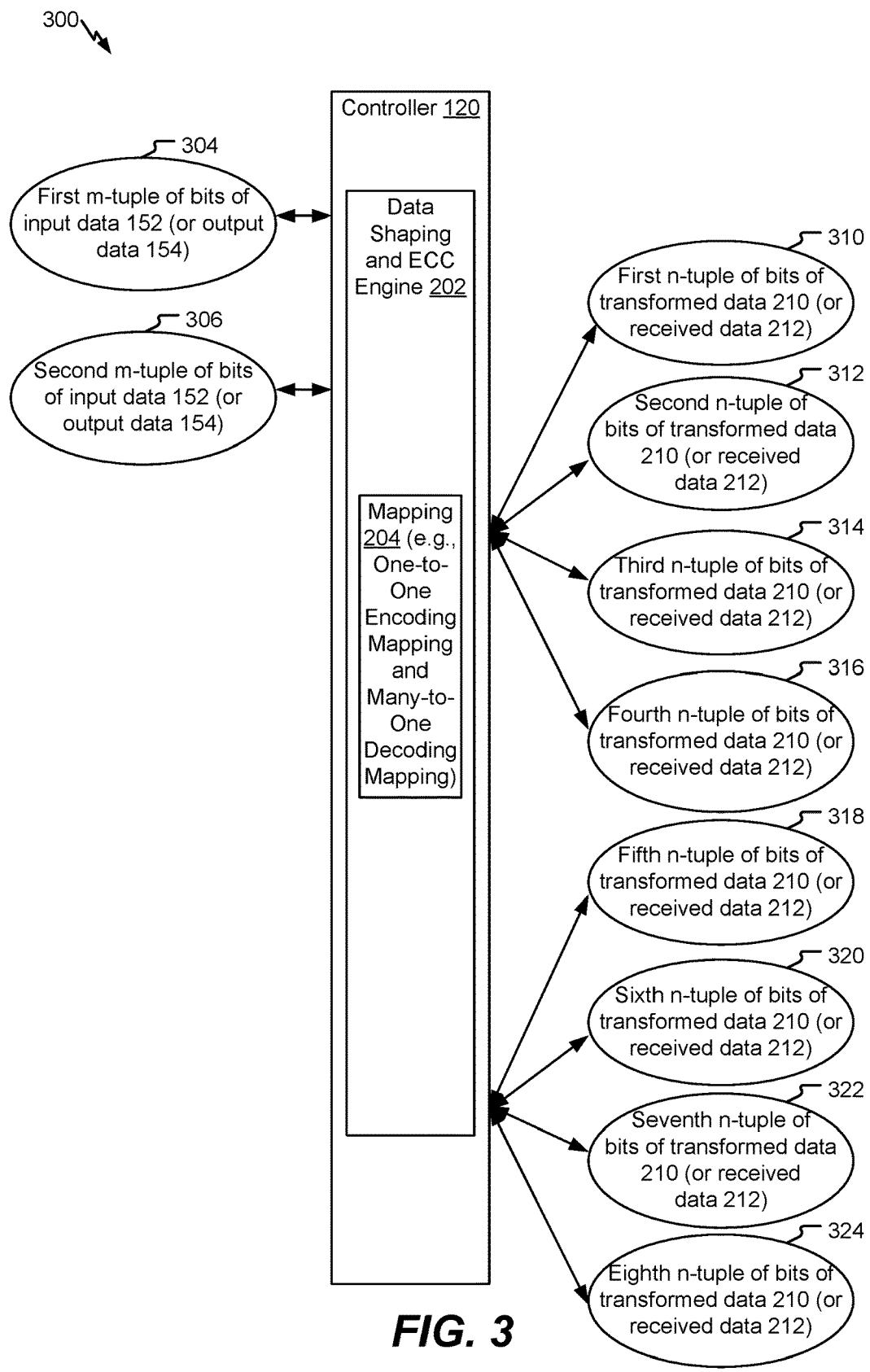
FIG. 3 is a diagram of an example of a mapping of input data to transformed data (or transformed data to input data)

Referring to FIG. 3, a diagram 300 of a particular example of the mapping applied in FIG. 1 to input data is illustrated. As illustrated in FIG. 3, the data shaping and ECC engine 202 applies the mapping 204 (e.g., the one-to-one encoding mapping) to the input data to generate n-tuples of the transformed data 210. Additionally, the data shaping and ECC engine 202 is configured to receive n-tuples of the received data 212 and to apply the mapping 204 (e.g., the many-to-one decoding mapping) to generate the de-shaped and error-corrected data 206. The de-shaped and error-corrected data 206 may be de-compressed by the data compression engine 166 prior to being output as the output data 154. The controller 120 including the data shaping and ECC engine 202 is illustrated as having access to a mapping table (e.g., tables of the one-to-one encoding mapping and the many-to-one mapping included in the mapping 204).

In the example illustrated in FIG. 3, the many-to-one decoding mapping of the mapping 204 is used to map eight illustrative n-tuples of the user data 152 to two m-tuples. For example, four n-tuples are mapped to a first m-tuple 304 of the output data 154. Particularly, a first n-tuple 310 of the transformed data 210, a second n-tuple 312 of the transformed data 210, a third n-tuple 314 of the transformed data 210, and a fourth n-tuple 316 of the transformed data 210 are mapped to the first m-tuple 304. Similarly, a corresponding fifth n-tuple 318 of the transformed data 210, a sixth n-tuple 320 of the transformed data 210, a seventh n-tuple 322 of the transformed data 210, and an eighth n-tuple 324 of the transformed data 210 are mapped to a second m-tuple 306 of the output data 154. In an alternate implementation, n-tuples of the transformed data 210 are mapped one-to-one to m-tuples of the output data 154, as described with reference to FIG. 1.

While the mapping has been described with respect to a many-to-one mapping from the eight n-tuples 310-324 to the m-tuples 304, 306, it should be understood that, during encoding, a one-to-one encoding mapping (included in the mapping 204) is used to generate the transformed data 210. The mapping 204 (e.g., the one-to-one encoding mapping and the many-to-one mapping) may be implemented by use of a lookup table. In other implementations, the mapping 204 may be implemented as an alternative data structure, such as a linked list or an alternative storage mechanism. While a single mapping 204 is shown in FIG. 3, it should be understood that multiple mapping tables may be used. Each of the multiple tables may correspond to or may be customized for a particular data shaping level, a particular data compression level, or both. In some implementations, a key or other index value may be used to link transformed data stored at a memory to the corresponding mapping table, as further described with reference to FIG. 4. Alternatively, the mapping may be an adaptive mapping, as further described with reference to FIG. 5.

Referring to FIG. 4, a diagram 400 of an example of generating transformed data using a static mapping is shown. In a particular implementation, FIG. 4 illustrates processing performed by the data storage device 102 of FIG. 1. For example, the processing is performed by the ECC engine 164 and the data shaping engine 162 of FIG. 1, using the mapping 174 of FIG. 1. In an alternate implementation, the processing is performed by the data shaping and ECC engine 202 (as shown by the dashed box) of FIG. 2 using the mapping 204 to generate the transformed data 210.

As illustrated in FIG. 4, the user data 152 is received at the ECC engine 164. The user data 152 may have one or more m-tuples. As described with reference to FIG. 1, the user data 152 may be received from the access device 150 by the controller 120. The user data 152 is error correction processed by the ECC engine 164 to generate the ECC codeword 172. The ECC codeword 172 is provided to the data shaping engine 162 as the input data, as described with reference to FIG. 1, and the data shaping engine 162 generates the transformed data 176. The transformed data 176 has one or more n-tuples. The data shaping engine 162 generates the transformed data 176 using the mapping 174 (e.g., the one-to-one encoding mapping). Although the ECC engine 164 and the data shaping engine 162 are illustrated as separate components, in other implementations, the operations of ECC engine 164 and the data shaping engine 162 may be performed by a single component. For example, the shaping and ECC engine 202 of FIG. 2, represented by a dashed box in FIG. 4, may perform ECC processing and data shaping as a single operation.

The mapping 174 may be generated (e.g., determined) by the data shaping engine 162 based on the input data and based on a target shaping level of the transformed data 176. For example, the mapping 174 may be determined by the data shaping engine 162 for use in generating transformed data having a reduced number of bit values having a particular logical state (e.g., a logical "0" value or a particular multi-bit value). For example, the data shaping engine 162 may generate (e.g., select or determine) the mapping 174 based on a frequency of m-tuples of the input data, a number of bit values having the particular value, and a target shaping level. To illustrate, the data shaping engine 162 may process the input data to determine a frequency of each m-tuple of the input data. The data shaping engine 162 may generate a table indicating the frequency of each m-tuple of the input data. Based on the frequency of each m-tuple of the input data, and based on a number of bit values of each m-tuple having a particular logical state (e.g., a logical "0" value or a particular multi-bit value), the data shaping engine 162 may map each m-tuple of the input data to multiple n-tuples. The mapping may be selected to meet a target difference level (e.g., a Hamming distance) condition, as described with reference to FIG. 1.

Determining an assignment of each m-tuple of the user data 152 to an n-tuple may generate the mapping 174. In particular example, an m-tuple that occurs most frequently may be mapped to n-tuple having the fewest number of bit values having a particular logical state (e.g., a logical "0" value or a particular multi-bit value) or an n-tuple mapped to a state which corresponds with a lower (or lowest) voltage band in a mapping of n-tuples to states of storage elements of the memory 104 (e.g., a NAND mapping). In this manner, the mapping 174 may be used to "shape" the user data 152 by reducing the number of bit values having the particular logical state or to divert programming of the memory 104 into lower voltage regions which reduces the wear of the memory 104. In a single level cell (SLC) NAND memory (e.g., a memory having storage elements that are programmed into one of only two states—the erase state and program state), these are equivalent if the erase state is mapped to logical bit '0'. Additionally, as described with reference to FIG. 1, one or more bit errors may be corrected or compensated for during de-shaping without causing the data shaping engine 162 to select an incorrect decoding (e.g., reverse) mapping.

In some implementations, the number 'n' (in the n-tuple) may be selected to meet the target shaping level. For example, the number 'n' may be selected such that each n-tuple has at most a particular number of bit values having the particular logical state. To further illustrate, if a target shaping level is associated with a 40/60 split of logical "0" values and logical "1" values, the number 'n' may be selected to be large enough such that the transformed data 176 has a 40/60 split between bits having logical "0" values and logical "1" values. In comparison, the input data may have an approximately 50/50 split of logical "0" values and logical "1" values. To further illustrate, as the shaping level increases, the number n may increase so that the transformed data 176 includes enough bits that do not have the particular value in order to meet the target shaping level. Alternatively, the shaping level may be selected to meet a target value of 'n'. For example, the transformed data 176 may be associated with a target size, which corresponds to a target value of n. The shaping level of the mapping 174 may be selected to meet the target value of n. To illustrate, as the number 'n' decreases, the shaping level may decrease.

In addition to generating the transformed data 176, the data shaping engine 162 may store the transformed data 176 at the memory 104. For example, the data shaping engine 162 (or the controller 120) may issue a write command to store the transformed data 176 at the memory 104. Additionally, the data shaping engine 162 may store the key 178 at the memory 104. The key 178 may indicate, or identify, the mapping 174. As one example, the data shaping engine 162 may include or store multiple mappings (including the mapping 174). In this example, the key 178 may be an indicator or an identifier that identifies a particular mapping (e.g., the mapping 174) stored at the data shaping engine 162. To compensate for errors in the memory 104, the key 178 may be ECC processed prior to storage at the memory 104.

In another implementation, the key 178 may be the table used by the data shaping engine 162 to perform the mapping 174. For example, after generating the mapping 174 and using the mapping 174 to generate the transformed data 176, the data shaping engine 162 may store the mapping table associated with the mapping 174 as the key 178 in the memory 104. The mapping table may be stored as a table, a linked list, or another data structure. Because a particular mapping is associated with generation of the transformed data 176 (e.g., the mapping 174 is a static mapping), the key 178 may be needed to efficiently decode the transformed data. Thus, the key 178 and the transformed data 176 are stored in the memory.

During a read operation to the memory 104, a transformed data representation (e.g., the received data 180 in FIG. 1) and the key 178 may be read and provided to the data shaping engine 162. In a particular implementation, the data shaping engine 162 may use the key 178 to identify a particular mapping stored at the data shaping engine 162, and the particular mapping (e.g., the mapping 174) may be used to decode the transformed data representation. In another example, the key 178 may be a mapping table, and the key 178 may be used to decode the transformed data representation. The transformed data representation may include multiple n-tuples and may have one or more bit errors, and each n-tuple of the transformed data representation may be mapped to an m-tuple of de-shaped data 182 in FIG. 1 using the mapping 174 identified by (or included in) the key 178. Thus, FIG. 4 illustrates an example implementation of a method performed by the data storage device 102 of FIG. 1, where the mapping is a static mapping and where the key 178 is stored in the memory 104 along with transformed data.

Referring to FIG. 5, a diagram 500 of an example of generating transformed data using an adaptive mapping is shown. In a particular implementation, FIG. 5 illustrates processing performed by the data storage device 102 of FIG. 1. For example, the processing is performed by the ECC engine 164 and the data shaping engine 162 of FIG. 1 using the mapping 174 of FIG. 1. In an alternate implementation, the processing is performed by the data shaping and ECC engine 202 (as shown by the dashed box) of FIG. 2 using the mapping 204 to generate the transformed data 210.

As illustrated in FIG. 5, the user data 152 is provided to the ECC engine 164. The user data 152 may have one or more m-tuples. The ECC engine 164 may receive the user data 152 and may generate the ECC codeword 172 based on the user data 152. The ECC codeword 172 may be provided to the data shaping engine 162 as input data, and the data shaping engine 162 may apply the mapping 174 to the input data to generate the transformed data 176. The transformed data 176 may have one or more n-tuples, where n is an integer that is greater than m. Although described as separate components, in other implementations, the operations of the ECC engine 164 and the data shaping engine 162 may be performed by a single component (the shaping and ECC engine 202 of FIG. 2).

FIG. 5 illustrates an implementation of adaptive data transformation (as indicated in FIG. 5 where the data shaping engine 162 includes an "adaptive algorithm"). To illustrate, the data shaping engine 162 may receive a first portion of the input data. The data shaping engine 162 may determine a frequency of each m-tuple of bits within the first portion of the input data. Based on the frequency of the m-tuples of the first portion of input data, the number of bit values having a particular value (e.g., a logical "0" value), and based on a target shaping level, the data shaping engine 162 may generate a first mapping 174 to apply to the input data. The data shaping engine 162 may apply the first mapping 174 to the first portion of the input data to generate a first portion of the transformed data 176. The transformed data 176 may be referred to as adaptively transformed data because the transformed data 176 may be mapped based on patterns within portions of the input data, as further described herein.

After writing the first portion of the transformed data 176 to the memory 104, the data shaping engine 162 may receive a second portion of the input data. The data shaping engine 162 may update the mapping 174 based the second portion of the input data and based on the mapping 174 prior to being updated. The updated mapping 174 may be based on the frequency of m-tuples of the second portion of the input data, the mapping 174 prior to updating, or both. In a particular implementation, the mapping 174 is updated based on past information processed by the data shaping and ECC engine 202 of FIG. 2 and then applied to a next chunk of input data. In this manner, metadata that determines the mapping 174 is not stored since in a causal system the de-shaper (e.g., the data shaping and ECC engine 202 performing de-shaping operations) can apply the same rules and recover the original data.

In a particular implementation, a first portion of the input data may have a higher number of logical "1" values (or a particular multi-bit value) as compared to a previous portion of the data, hence the mapping selected for the first portion can vary to have in total a uniform number of logical "1" values (or a particular multi-bit value) in the transformed data 176. Nevertheless, the probability of such events depends on the input data. Typically, when data patterns have some locality characteristics, a mapping that is set to reduce the number of logical "0" values in one portion of the input data (and thus increase the number of logical "1" values in the transformed data of the portion) and that is applied to the next portion of the input data may result in an increased number of logical "1" values for the next portion of the input data. A second portion of the input data may also have higher frequency of certain m-tuples, thus allowing the mapping 174 to be adapted accordingly to produce a higher percentage of logical "1" values in the transformed data 176. This adaptive mapping can be performed using different mapping tables or by setting n-tuples with a higher number of logical "1" values to be defined as an output n-tuple for the m-tuples that occur with the higher frequency, thus increasing the overall percentage of logical "1" values in the transformed data 176 that is programmed to memory 104. In other implementations, a sliding window may be used to determine an amount of previous counts of m-tuples to use in updating the mapping 174. Thus, the data shaping engine may perform adaptive data transformation by adaptively updating the mapping 174 based on each portion of the user data 152 (e.g., the ECC codeword 172 based on the user data 152) as the portion is processed. Adaptively updating the mapping 174 may improve data shaping by allowing the data shaping engine 162 to take advantage of patterns as they occur in portions of the input data. However, the adaptive data shaping may use increased complexity hardware and may be more expensive than using fixed mappings, as described with reference to FIG. 4. After updating the mapping 174, the data shaping engine 162 may generate a second portion of the transformed data 176 and may write the second portion of the transformed data 176 to the memory 104. Processing may continue for each remaining portion of the input data until an entirety of the input data has been transformed into the transformed data 176, and each portion of the transformed data 176 has been written to the memory 104.

In a particular implementation, the mapping 174 is changing between shaping of each portion of the input data into each portion of the transformed data 176. For example, with reference to the illustrative mapping shown in Table 1, if the m-tuple 1000 occurs at a higher frequency than the m-tuple 0000, then after a portion of the input data is processed, the mapping 174 would be modified to assign the output n-tuple 11111111 to be the mapped output of the m-tuple 1000 rather than remaining the output n-tuple of the m-tuple 0000 (as shown in Table 1). In order to maintain the adaptivity of the mapping 174 without storing side information (e.g., the key 178), the mapping 174 is not changed very often. As a particular example, the mapping 174 may be changed after shaping of a particular portion (e.g., an "ECC chunk") of the input data, in order to reduce or minimize decoding error propagation. To illustrate, a mapping determined based on a first portion (e.g., a first ECC chunk) of the input data may be applied to a next consecutive portion. Thus, once a first portion of the input data is de-shaped, the mapping 174 is updated for use in de-shaping the next portion. In a particular example, the input data is thirty-two KB, a fixed (e.g., pre-programmed) mapping may be used for de-shaping a first two KB portion (e.g., a first portion), and after the first two KB portion is de-shaped the mapping 174 is updated. The updated mapping 174 is used to de-shape the next two KB portion, and after de-shaping, the mapping 174 is updated again. Thus, the mapping 174 is updated after processing each two KB portion of the input data, and the updated mapping 174 is used to de-shape the next portion.

With respect to FIG. 1, when transformed data is read from the memory 104, the data shaping engine 162 may receive a transformed data representation (e.g., the received data 180) and may perform a reverse mapping operation to process the transformed data representation into the de-shaped data 182. Where n-tuples are defined, an initial mapping of m-tuples to n-tuples is known, and an adaptive transform procedure is applied by the data shaping engine 162, an inverse of the adaptive transform procedure may be applied to generate the de-shaped data 182 from the received data 180. For example, a first "chunk" of transformed data may be received from the memory 104 and processed using the mapping 174. The mapping 174 may be modified based on the first chunk of transformed data (e.g., based on a distribution of n-tuples in the first chunk of transformed data), and the modified mapping 174 may be used to process a second chunk of transformed data. Such operations (e.g., processing a chunk of transformed data followed by modifying the mapping 174) may continue until an entirety of transformed data received from the memory 104 is processed.

Thus, FIG. 5 illustrates an example implementation of processing performed by the data storage device 102 of FIG. 1, where the data transformation is an adaptive (e.g., dynamic) transformation. FIG. 5 thus describes an implementation where, for each n-tuple of bits in the adaptive mapping 174, the n-tuple of bits has more bits having a first value and fewer bits having a second value, and the adaptive mapping 174 is modified based on inputs (e.g., "chunks" of input data) to the adaptive mapping 174 and a previous state of the adaptive mapping 174. Adaptively transforming the data may enable better shaping by taking advantage of patterns in portions of the input data.

Figure 6:
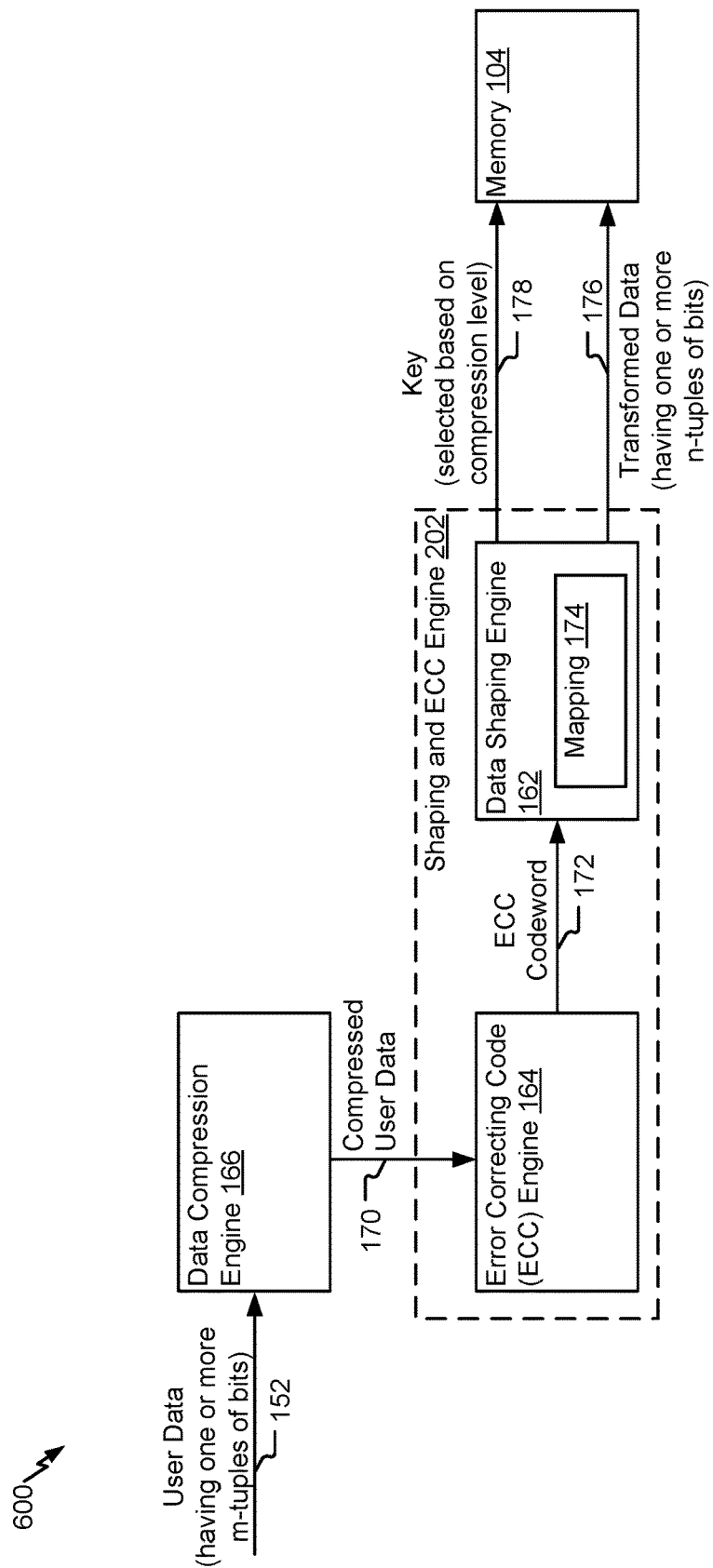
FIG. 6 is a diagram that illustrates an example of a system that is configured to generate transformed data after data compression.

Referring to FIG. 6, a diagram 600 of an example of generating transformed data after data compression is shown. In a particular implementation, FIG. 6 illustrates processing performed by the data storage device 102 of FIG. 1. For example, the processing is performed by the ECC engine 164 and the data shaping engine 162 of FIG. 1, using the mapping 174 of FIG. 1. In an alternate implementation, the processing is performed by the data shaping and ECC engine 202 (as shown by the dashed box) of FIG. 2 using the mapping 204 to generate the transformed data 210.

As illustrated in FIG. 6, the user data 152 is received by the data compression engine 166. The data compression engine 166 may be configured to receive the user data 152 and to compress the user data 152 to generate the compressed user data 170. The data compression engine 166 may be configured to generate the compressed user data 170 based on a compression level or based on multiple compression levels. As one example, the data compression engine 166 may compress the user data 152 based on the single compression level to generate the compressed user data 170. As another example, the data compression engine 166 may compress the user data 152 based on the first compression level, and then may further compress the user data 152 based on the second compression level (or multiple other compression levels) to generate the compressed user data 170. Although not illustrated, the data compression engine 166 may also provide a compression level indicator of the compression level used to generate the compressed user data 170 to the ECC engine 164. In other implementations, the ECC engine 164, the data shaping engine 162, or both, may be configured according to the compression level used to generate the compressed user data 170 or according to the actual compression level reached by the data compression engine 166.

The ECC engine 164 received the compressed user data 170 from the data compression engine 166 and may generate the ECC codeword 172 based on the compressed user data 170. The ECC codeword 172 may have one or more m-tuples. The ECC engine 164 may provide the ECC codeword 172 to the data shaping engine 162 as input data. The data shaping engine 162 may be configured to apply the mapping 174 to the input data to generate the transformed data 176. The transformed data 176 may have one or more n-tuples, where n is an integer that is greater than m. Although described as separate components, in other implementations, the operations of the ECC engine 164 and the data shaping engine 162 may be performed by a single component (the shaping and ECC engine 202 illustrated in FIG. 6 using a dashed box).

The data shaping engine 162 may be configured to generate the mapping 174 based on the input data and based on the compression level used by the data compression engine 166 to generate the compressed user data 170. The user data 152 may be compressed one or more times, using a compression level (or multiple compression levels), to generate the compressed user data 170. In some implementations, the data compression engine 166 may select the compression level based on a target shaping level or a target size of the transformed data 176. For example, the user data 152 may be compressed using one or more compression levels (e.g., a low compression level, a medium compression level, and a high compression level, as non-limiting examples). By compressing the user data 152 prior to shaping, at least some patterns may be reduced in the user data 152, which may reduce the effectiveness of shaping that does not increase the size of the transformed data 176 (e.g., to enable inclusion of more bit values that do not have the particular value). However, compressing the user data 152 decreases the size of the user data 152, which can decrease the size of the transformed data 176, depending on the shaping level. Thus, the data compression engine 166 and the data shaping engine 162 may work together to meet a target shaping level or a target size of the transformed data 176. In a particular implementation, the transformed data 176 is the same size as the user data 152. Alternatively, the transformed data 176 may be larger than the user data 152. In a particular implementation, the data shaping engine 162 expands the compressed data to the original size before compression in a manner that increases the number of logical '1' values. Thus, the total user information (or user data) size is maintained and system-wise there are no changes due to the compression and the ECC coding. The ECC engine 164 then protects the shaped data. In a read path (e.g., in a path from the memory 104 through the controller 120 to the access device 150), the ECC engine 164 first corrects the received data 180, then the error-corrected data is de-shaped to the compressed format, the data compression engine 166 de-compresses the de-shaped data to recover the original user data.

To illustrate, to meet a target shaping level, the data compression engine 166 may select a compression level that enables the data shaping engine 162 to determine the mapping 174 to meet the target shaping level. For example, the data compression engine 166 may select a lower compression level to enable the data shaping engine 162 to take advantage of patterns in the user data 152 to reach the target shaping level without having a large difference between m and n (e.g., without having a large size difference between the user data 152 and the transformed data 176). Alternatively, the data compression engine 166 may select a higher compression level to enable the data compression engine 166 to meet a target size (e.g., a target number of bits) of the transformed data 176. In this example, the data shaping engine 162 may provide as much shaping as possible while still meeting the target size of the transformed data 176 (e.g., a target value of n). Thus, the data compression engine 166 may select the compression level based on a target shaping level or a target size of the transformed data 176, and the data shaping engine 162 may determine the mapping 174 based at least in part on the compression level. In a particular implementation, the data compression engine 166 compresses the data as much as possible and then the data shaping engine 162 selects a shaping level that corresponds to expand the shaped data to the size of the input data before compression.

After generating the transformed data 176 using the mapping 174, the data shaping engine 162 may store the transformed data 176 at the memory 104. In the implementation illustrated in FIG. 6, the mapping is a static mapping. Thus, as described with reference to FIG. 4, the data shaping engine 162 may generate and store the key 178 at the memory 104. Because the mapping 174 is determined based on the compression level, the key 178 may be selected (e.g., generated) based on the compression level.

During a read operation, a transformed data representation (e.g., the received data 180) and the key 178 may be read from the memory 104. The data shaping engine 162 may use the key 178 to decode (e.g., de-shape) the transformed data representation into output data, as described above with reference to FIG. 4. For example, the data shaping engine 162 may process n-tuples of the received data 180 of FIG. 1 into m-tuples of the de-shaped data 182, as described above. After the de-shaped data 182 of FIG. 1 is generated (and processed by the ECC engine 164), the output data may be decompressed by the data compression engine 166. The data compression engine 166 may decompress the de-shaped data 182 of FIG. 1 based on the compression level used to compress the user data 152. After decompression, the de-shaped data 182 may be provided to the access device 150 of FIG. 1 as the output data 154. Thus FIG. 6 illustrates an implementation of a system that enables data to be compressed prior to ECC processing and shaping.

Figure 7:
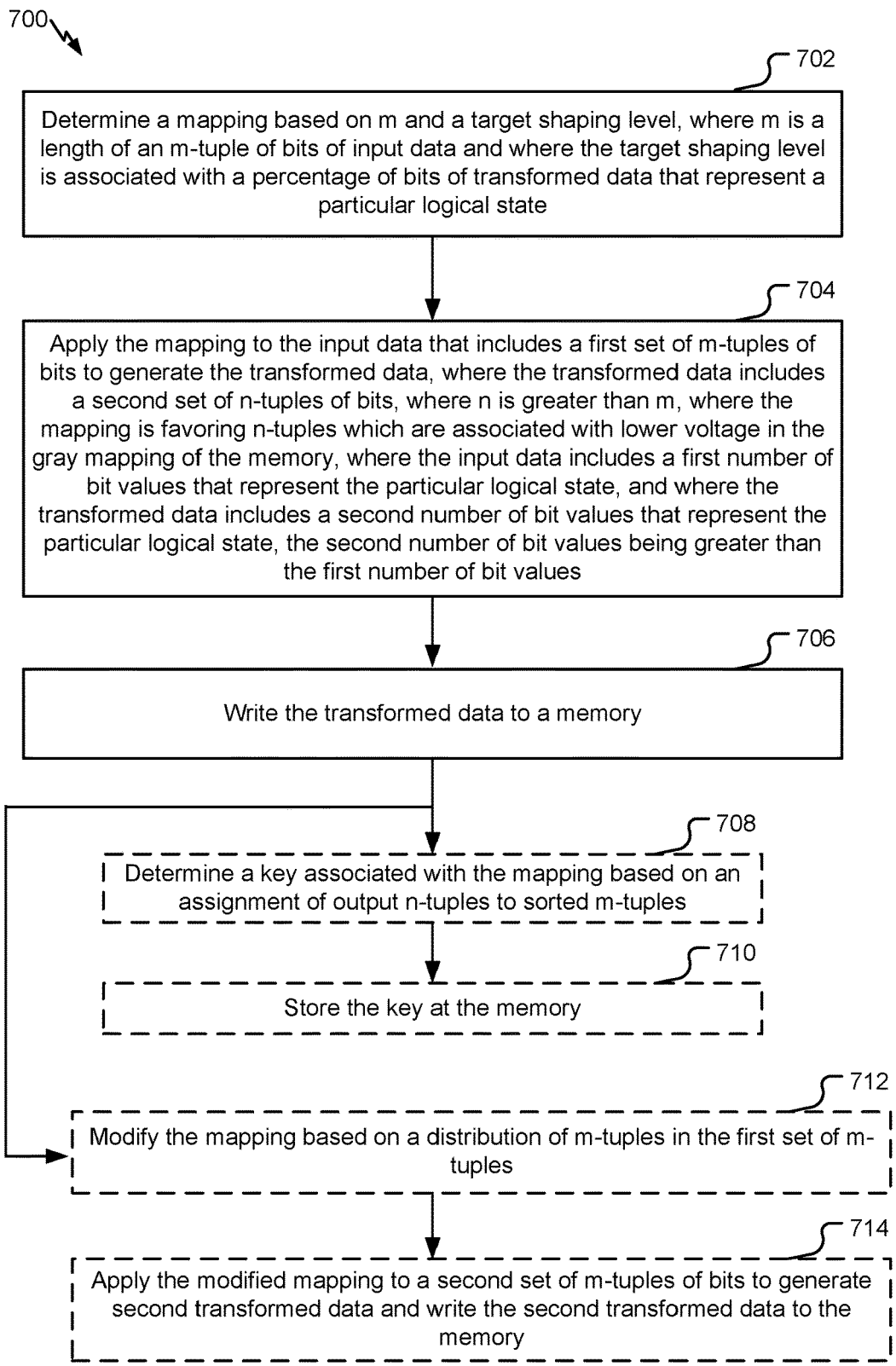
FIG. 7 is a flow diagram that illustrates a first example of a method of applying a mapping to input data to generate transformed data (e.g., shaped data)

Referring to FIG. 7, a particular illustrative example of a method 700 of processing data at a data storage device is shown. The method 700 may be a method of applying a mapping to input data to generate transformed data (e.g., shaped data). Writing the transformed data to a memory may reduce wear as compared to writing data that is not shaped, and in some implementations, one or more bit errors in transformed data may be compensated for during de-shaping of the transformed data. The method 700 may be performed at a device including a memory such as the data storage device 102 of FIG. 1.

The method 700 may include determining a mapping based on m (e.g., a target length of tuples of input data) and a target shaping level, at 702. To illustrate, m is a length of an m-tuple of bits of input data, and the target shaping level is associated with a number of bit values of transformed data that represent a particular logical state. An example of a target shaping level indicates a number of logical "1" values, a ratio of logical "1" values to logical "0" values, or a percentage of logical "1" values versus logical "0" values. For example, a target shaping level may have a 70/30 ratio of logical "1" values and logical "0" values, or a target percentage of 70% logical "1" values. In other implementations, the target shaping level indicates a number of a first multi-bit value, a ratio of a first multi-bit value to a second multi-bit value, or a percentage of a first multi-bit value versus a second multi-bit value.

The method 700 includes applying the mapping to input data that includes a first set of m-tuples of bits to generate transformed data, at 704. For example, the data shaping engine 162 includes a mapping 174, and the mapping 174 may be applied to input data (e.g., the user data 152, the ECC codeword 172, or the compressed user data 170), to generate the transformed data 176. The transformed data 176 includes a second set of m-tuples of bits, where n is an integer value that is greater than m. A relationship of a gray coding of m-tuples of bits to a gray coding of n-tuples of bits is indicated by the mapping 174, as illustrated with reference to Table 1. In a particular implementation, the gray coding of m-tuples of bits includes $2^m$ m-tuples of bits, and the gray coding of n-tuples of bits includes a subset of $2^n$ possible n-tuples of bits (e.g., some possible n-tuple of bits are not included in the gray coding of n-tuples of bits).

The input data to the data shaping engine 162 includes a first number of bit values that represent a particular logical state. The transformed data 176 includes a second number of bit values that represent the particular logical state, and the second number of bit values is less than the first number of bit values. For example, the bit values may include single-bit values, and the particular logical state may be indicated by a single bit. To illustrate, if the particular logical state is a logical "0" value, then there are a higher percentage of logical "1" values in the transformed data 176 than in the input data. As a further example, if the input data has 50% logical "1" values and 50% logical "0" values, the ratio of logical "1" values to logical "0" values for the transformed data 176 may be 60/40 or 70/30. Thus, the transformed data 176 may have a higher percentage or number of logical "1" values than the input data to the data shaping engine 162. As another example, the bit values may include multi-bit values, and the particular logical state may be indicated by multiple bits. To illustrate, the memory may include multi-level cells configured to store multiple bits of data as a voltage of a single memory element. If the particular value is a multi-bit value that corresponds to a voltage that causes less wear the memory elements than other voltages, then there are a higher percentage of the particular multi-bit value in the transformed data 176 than in the input data.

The method 700 further includes writing the transformed data to a memory, at 706. For example, the transformed data 176 may be stored at the memory 104 (e.g., at the group of storage elements 106). Writing the transformed data 176 may reduce wear to the memory 104 as compared to storing data having an approximately equal distribution of logical "0" values and logical "1" values (e.g., unshaped parity data).

The method 700 may further include additional optional steps, such as determining a key associated with the mapping based on an assignment of output n-tuples to sorted m-tuples, at 708, and storing the key at the memory, at 710. For example, the key 178 that corresponds to the mapping 174 may be provided to the memory 104. The stored key 178 is then subsequently used during a read operation to perform decoding, where the key 178 links to a particular mapping within the data shaping engine 162. Alternatively, the key 178 includes data indicating a mapping table used to apply the mapping 174 to data. Thus, the type of mapping may be selected and used for encoding and decoding by use of different keys. In a particular implementation, determining the mapping 174 includes determining a particular m-tuple having a highest a frequency in the input data and assigning a particular output n-tuple to the particular m-tuple based on a number of bit values in the particular output n-tuple that represent the particular logical state. For example, a first m-tuple of the gray coding of m-tuples of the mapping 174 may be the m-tuple that has the highest frequency in the input data, and the first n-tuple in the gray coding of n-tuples of the mapping 174 may be the n-tuple having the fewest number of bit values having the particular logical state (e.g., the logical "0" value or a particular multi-bit value). The key 178 may be determined based on this assignment of m-tuples to n-tuples. Data indicating the assignment (e.g., the mapping) of m-tuples to n-tuples may be stored as the key 178.

In another optional implementation, the method 700 further includes modifying the mapping based on a distribution of m-tuples in the first set of m-tuples, at 712. For example, with reference to adaptive shaping as described in FIG. 5, the data shaping engine 162 may modify (e.g., update) the mapping 174 during processing of a second portion of the input data. The mapping 174 may be modified based on patterns of m-tuples in the input data. The optional step of modifying the mapping 174 may be used to dynamically adapt the mapping 174 based on the nature of the input data received. Thus, the mapping 174 may change during processing of input data and may provide improved endurance (e.g., of the memory 104) based on reacting to patterns of input data received during operation. Typically, the mapping 174 is changed according to a second portion of the input data and the changed (e.g., modified) mapping is to be used on a third portion of the input data.

Additionally, the method 700 may further include applying the modified mapping, acquired from (e.g., determined based on) the first portion of the input data, to a second set of m-tuples of bits to generate second transformed data and writing the second transformed data to the memory, at 714. The second transformed data may be written to the memory, such as the memory 104 illustrated in FIG. 1. The mapping 174 may be modified according to a distribution of m-tuples in the first set of m-tuples. For example, the data shaping engine 162 may modify the mapping 174 based on a distribution (e.g., a frequency) of m-tuples in the first set of m-tuples. Thus, the mapping 174 may be modified after each portion of the input data is processed to take advantage of patterns that occur in portions of the input data.

Additionally, the method 700 may further include reading the second transformed data from the memory, applying the modified mapping to n-tuples of bits of the second transformed data to decode the second transformed data, and further modifying the modified mapping based on a distribution of n-tuples in the second transformed data after error correction code (ECC) processing is performed on the second transformed data. The mapping may include an encoding mapping and a decoding mapping, and modifying the mapping may include modifying the encoding mapping and modifying the decoding mapping. To illustrate, after reading transformed data from the memory 104, the data shaping engine 162 of FIG. 5 may receive and decode (e.g., de-shape) a first group of n-tuples of the received data 180 based on the mapping 174 to generate a first group of m-tuples of the de-shaped data 182. The mapping 174 (e.g., the decoding mapping) used to de-shape the data may be modified after de-shaping the first group of n-tuples, as described with reference to FIG. 5. Additionally, the method 700 may further include reading the transformed data from the memory and applying the further modified mapping to n-tuples of bits of the transformed data (according to the de-shaping of the first group of n-tuples) to decode the transformed data of a second group of n-tuples. For example, the data shaping engine 162 may modify the mapping 174 based on a distribution of n-tuples in the second transformed data, and the modified mapping 174 may be used to decode (e.g., de-shape) the first transformed data.

In another particular implementation, for each n-tuple of bits in the mapping, the n-tuple of bits may have more bits having a first value and fewer bits having a second value than a corresponding m-tuple of bits. For example, the n-tuples of bits may have more bits having a logical "1" value (or a first multi-bit value) and fewer bits having a logical "0" value (or a second multi-bit value) than the corresponding m-tuples in the mapping. Additionally, the mapping may include an adaptive mapping that is modified based on inputs to the adaptive mapping and a previous state of the adaptive mapping. For example, after being applied to a set of m-tuples of bits, the mapping may be modified (e.g., updated) based on the current mapping and based on a distribution of m-tuples of bits in the set of m-tuples of bits, as further described with reference to FIG. 5.

In another particular implementation, the method 700 includes compressing the input data prior to applying the mapping to the input data. For example, the user data 152 may be compressed by the data compression engine 166 to generate the compressed user data 170, which is processed by the ECC engine 164 and provided to the data shaping engine 162 as the input data.

Figure 8:
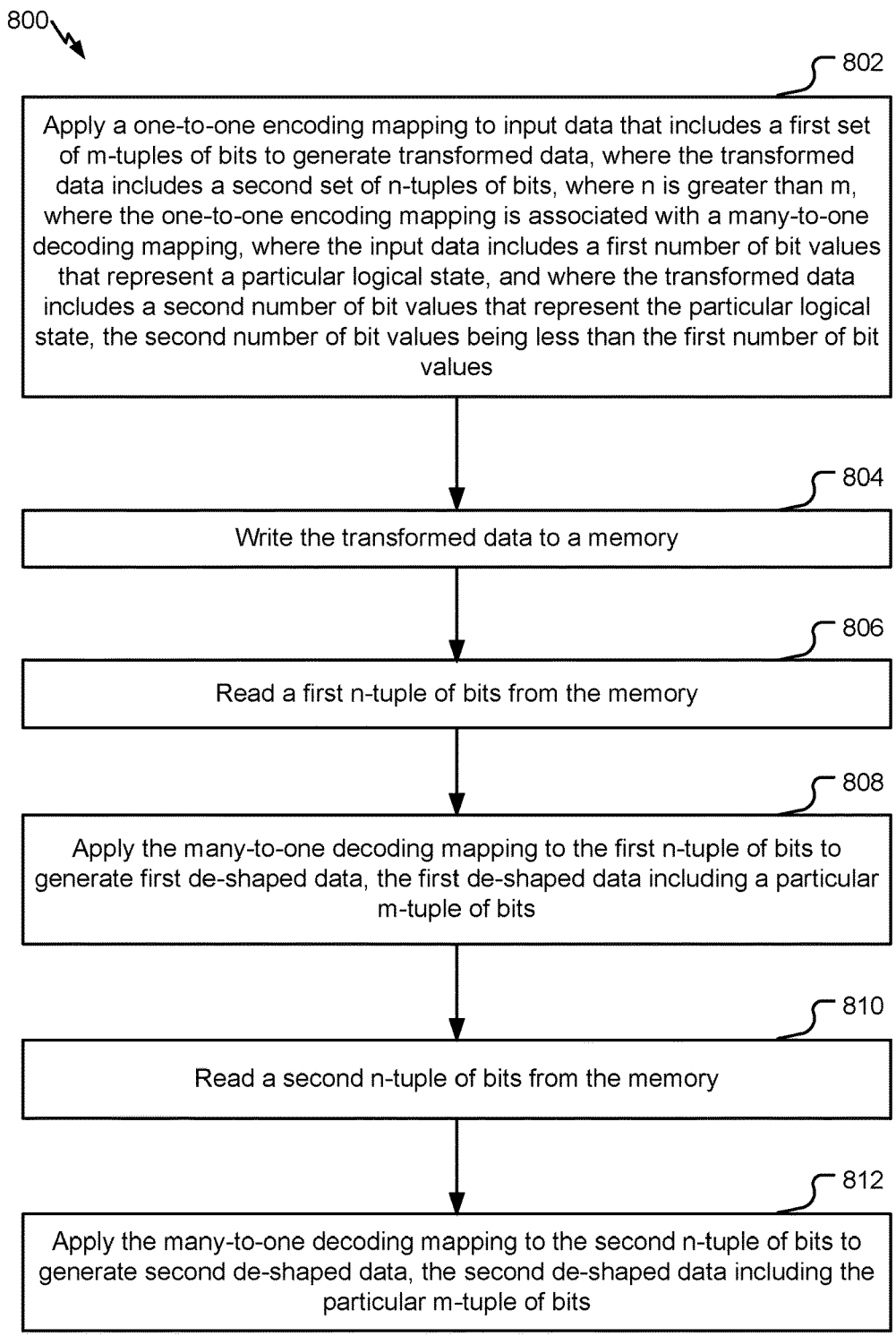
FIG. 8 is a flow diagram that illustrates a second example of a method of applying a mapping to input data to generate transformed data (e.g., shaped data)

Referring to FIG. 8, a particular illustrative example of a method 800 of processing data at a data storage device is shown. The method 800 may be a method of applying a mapping to input data to generate transformed data (e.g., shaped data). One or more bit errors in transformed data may be corrected for during de-shaping of the transformed data. The method 800 may be performed at a device including a memory such as the data storage device 102 of FIG. 2.

The method 800 may include applying a one-to-one encoding mapping to input data that includes a first set of m-tuples of bits to generate transformed data, at 802. The transformed data may include a second set of n-tuples of bits, where n is greater than m. The one-to-one encoding mapping (included in the mapping 204) may be associated with a many-to-one decoding mapping (included in the mapping 204). The input data may include a first number of bit values that represent a particular logical state, and the transformed data may include a second number of bit values that represent the particular logical state. In some implementations, the input data may be compressed prior to applying the one-to-one encoding mapping, and the second number of bit values are less than the first number of bit values. To illustrate, the data shaping and ECC engine 202 may apply the mapping 204, which includes a one-to-one encoding mapping and a many-to-one decoding mapping, to input data (e.g., the user data 152 or the compressed user data 170) to generate the transformed data 210. The transformed data 210 may have more logical "1" values and fewer logical "0" values than the input data. As a further example, if the input data has 50% logical "1" values and 50% logical "0" values, the ratio of logical "1" values to logical "0" values for the transformed data 210 may be 60/40 or 70/30. Thus, the transformed data 210 may have a higher percentage or number of logical "1" values than the input data to the data shaping and ECC engine 202.

The method 800 further includes writing the transformed data to a memory, at 804. For example, the transformed data 210 may be stored at the memory 104 (e.g., at the group of storage elements 106). Writing the transformed data 210 may reduce wear to the memory 104 as compared to storing data having an approximately equal distribution of logical "0" values and logical "1" values (e.g., unshaped parity data).

The method 800 may further include additional steps, such as reading a first n-tuple of bits from the memory, at 806, and applying the many-to-one decoding mapping to the first n-tuple of bits to generate first de-shaped data, at 808, the first de-shaped data including a particular m-tuple of bits. For example, the data shaping and ECC engine 202 may receive a first n-tuple of bits from the memory 104, and the data shaping and ECC engine 202 may apply the many-to-one decoding mapping of the mapping 204 to the first n-tuple of bits to generate a particular m-tuple of bits of the de-shaped and error-corrected data 206. Additionally, the method 800 may further include reading a second n-tuple of bits from the memory, at 810, and applying the many-to-one decoding mapping to the second n-tuple of bits to generate second de-shaped data, at 812, the second de-shaped data including the particular m-tuple of bits. For example, the data shaping and ECC engine 202 may receive a second n-tuple of bits from the memory 104, and the data shaping and ECC engine 202 may apply the many-to-one decoding mapping of the mapping 204 to the second n-tuple of bits to generate the particular m-tuple of bits of the de-shaped and error-corrected data 206. The second n-tuple of bits may have one or more bit errors, and because the second n-tuple of bits is decoded to the particular m-tuple of bits despite the one or more bit errors, the one or more bit errors may be compensated for.

In a particular implementation, the mapping may be an adaptive mapping. For example, after applying the mapping to a first portion (e.g., chunk) of the input data to generate a first portion of the output data, the mapping may be updated based on the first portion of the input data prior to being applied to a second portion of the input data. When the adaptive mapping is used to de-shape data, the mapping may be applied to a first portion of received data to generate a first portion of de-shaped data. After the first portion of de-shaped data is generated, ECC correction is performed on the first portion of de-shaped data to generate a first portion of corrected data. The mapping is updated based on the first portion of corrected data prior to being applied to a second portion of the received data. In this manner, errors in the received data may be corrected prior to updating the mapping such that the errors do not cause the mapping to generate incorrect de-shaped data.

In another particular implementation, the method 800 includes storing a key associated with the one-to-one encoding mapping and the many-to-one decoding mapping in the memory. For example, the controller 120 may store the key 178 corresponding to the mapping 204 at the memory 104. Additionally, the method 800 may further include performing ECC processing on the key prior to storing the key. For example, the key 178 may be ECC processed by the data shaping and ECC engine 202 prior to storage. In another particular implementation, the method 800 includes compressing the input data prior to applying the one-to-one encoding mapping to the input data. For example, the user data 152 may be compressed by the data compression engine 166 to generate the compressed user data 170, which is provided to the data shaping and ECC engine 202 as the input data.

In another particular implementation, the method 800 may further include modifying the one-to-one encoding mapping based on a distribution of m-tuples in the first set of m-tuples, applying the modified one-to-one encoding mapping to a second set of m-tuples of bits to generate second transformed data, and writing the second transformed data to the memory. Adaptive mapping is further described with reference to FIG. 5. In another particular implementation, the method 800 may further include reading a second set of n-tuples of bits from the memory, applying the many-to-one decoding mapping to the second set of n-tuples of bits to generate first de-shaped data, modifying the many-to-one decoding mapping based on a distribution of n-tuples in the second set of n-tuples, reading a third set of n-tuples of bits from the memory, and applying the modified many-to-one decoding mapping to the third set of n-tuples of bits to generate second de-shaped data.

In another particular implementation, the method 800 may further include receiving an additional portion of the input data, encrypting the input data to generate encrypted data, and applying the one-to-one encoding mapping to the encrypted data to generate shaped data, where the shaped data and the additional portion of the input data are substantially the same size. In this implementation, the method 800 also includes performing error correction code (ECC) processing on the shaped data to generate encoded data and parity data, rotating the parity data with respect to the encoded data to generate second transformed data, and writing the second transformed data to the memory.

Figure 9:
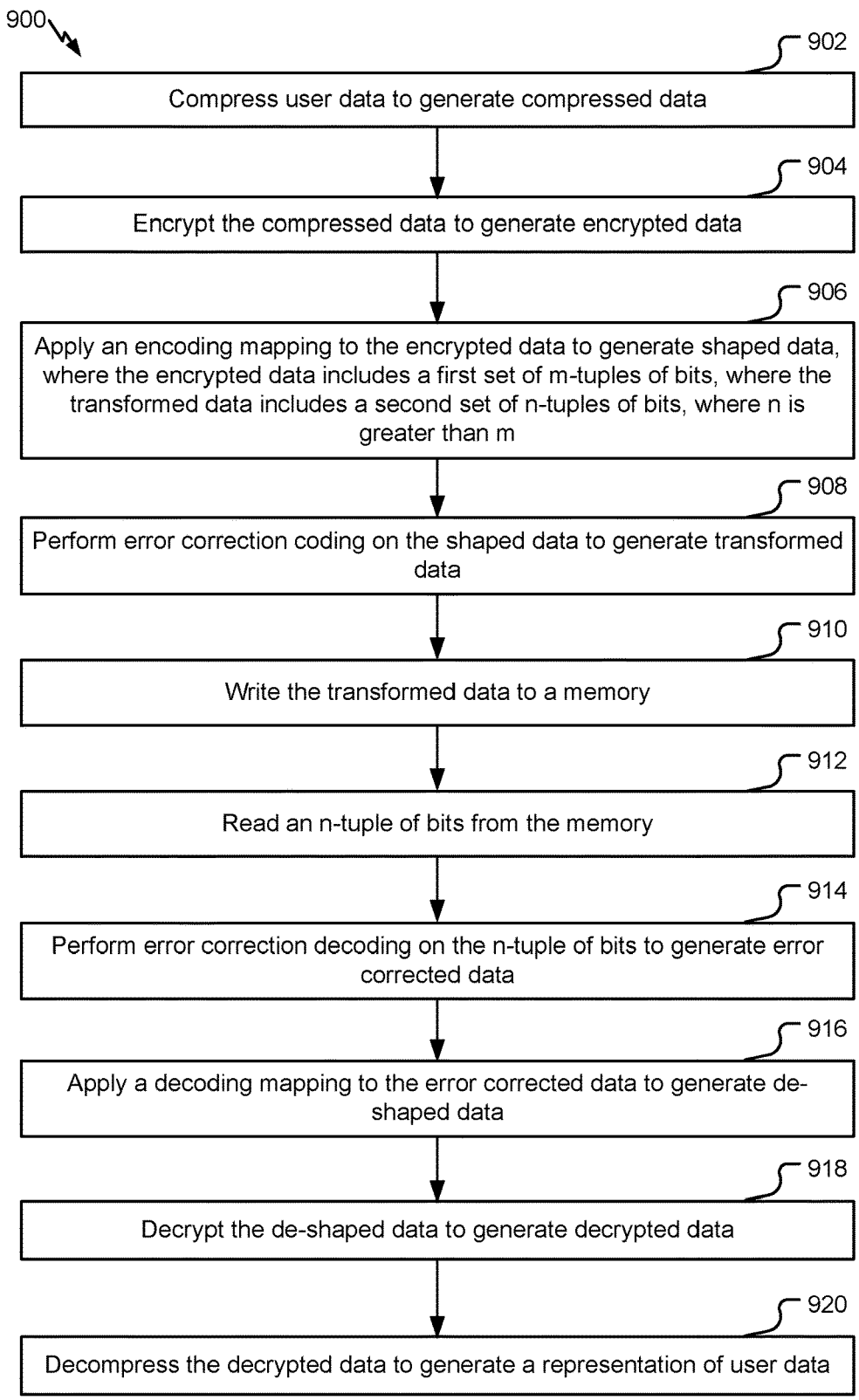
FIG. 9 is a flow diagram that illustrates a third example of a method of applying a mapping to input data to generate transformed data (e.g., shaped data).

Referring to FIG. 9, a particular illustrative example of a method 900 of processing data at a data storage device is shown. The method 900 may be a method of applying a mapping to input data to generate transformed data (e.g., shaped data). The input data may be encrypted data that is encrypted by a memory controller (as opposed to an access device or a host device). The method 900 may be performed at a device including a memory such as the data storage device 102 of FIG. 1 or the data storage device 102 of FIG. 2.

The method 900 may include compressing user data to generate compressed data, at 902. For example, the data compression engine 166 of FIG. 1 may receive the user data 152 and compress the user data 152 to generate the compressed user data 170. The method 900 may include encrypting the compressed data to generate encrypted data, at 904. For example, an encryption engine may encrypt the compressed user data 170 to generate encrypted data. In a particular implementation, encrypting data does not increase a size of the data. Alternatively, encrypting the data may increase a size of the data by a negligible amount (e.g., the increase to the size of the data caused by the encryption may be compensated for by a later process, such as shaping or ECC coding, such that transformed data stored at the memory 104 based on encrypted data has the same size as transformed data based on unencrypted data).

The method 900 may include applying an encoding mapping to the encrypted data to generate shaped data, at 906. The encrypted data includes a first set of m-tuples of bits, the transformed data includes a second set of n-tuples of bits, and n is greater than m. To illustrate, the data shaping engine 162 may generate shaped data based on the encrypted data. In a particular implementation, the encoding mapping may indicate a relationship of a gray coding of m-tuples to a gray coding of n-tuples. In another particular implementation, the encoding mapping may be a one-to-one encoding mapping that is associated with a many-to-one decoding mapping. The shaped data has n-tuples of bits, the encrypted data has m-tuples of bits, and n is greater than m. The method 900 may include performing error correction coding on the shaped data to generate transformed data, at 908. For example, the ECC engine 164 of FIG. 1 may perform ECC coding on the shaped data to generate transformed data (e.g., error corrected shaped data).

The method 900 may include writing the transformed data to a memory, at 910. For example, the controller 120 may write the transformed data (e.g., the error corrected shaped data) to the memory 104. The method 900 may include reading an n-tuple of bits from the memory, at 912. For example, the controller 120 may read an n-tuple of bits (e.g., the controller 120 may receive the received data 180) from the memory 104.

The method 900 may include performing error correction decoding on the n-tuple of bits to generate error corrected data, at 914. For example, the ECC engine 164 of FIG. 1 may perform ECC decoding on the n-tuple of bits (e.g., the received data 180) to generate the error corrected data. Performing ECC decoding prior to de-shaping the data may prevent errors resulting from reading the n-tuple of bits from propagating to data de-shaping, which prevents de-shaping from generating incorrect de-shaped data. The method 900 may include applying a decoding mapping to the error corrected data to generate de-shaped data, at 916. For example, the data shaping engine 162 may apply the mapping 174 to the error corrected data to generate the de-shaped data.

The method 900 may include decrypting the de-shaped data to generate decrypted data, at 918. For example, the encryption engine (or a decryption engine) may decrypt the de-shaped data to generate the decrypted data. The method 900 may further include decompressing the decrypted data to generate a representation of user data, at 920. For example, the data compression engine 166 may decompress the decrypted data to generate the output data 154 (e.g., a representation of user data).

By encrypting the data at the controller 120 after the user data 152 is compressed by the data compression engine 166 (and decrypting the de-shaped data prior to decompression), the method 900 may enable enhanced security due to the encryption and may enable shaping of encrypted data without increasing the size of data to be stored, as may be the case if the access device 150 encrypts the user data 152 prior to providing the user data 152 to the controller 120, such that shaping of the encrypted data may require adding additional bits. Although particular steps of the method 900 have been described above, in other implementations, the method 900 may omit one or more of the above-described steps, or one or more steps may be performed in a different order. Additionally or alternatively, one or more of the steps of the method 900 may be combined in a single step.

The method 700 of FIG. 7, the method 800 of FIG. 8, the method 900 of FIG. 9, or a combination thereof, may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, method 700 of FIG. 7, the method 800 of FIG. 8, the method 900 of FIG. 9, or a combination thereof, can be initiated or controlled by one or more processors, such as one or more processors included in or coupled to a controller or a memory of the data storage device 102 and/or the access device 150 of FIGS. 1 and 2. As an example, the method 700 of FIG. 7, the method 800 of FIG. 8, the method 900 of FIG. 9, or a combination thereof, individually or in combination, may be performed by the controller 120 of FIGS. 1 and 2. To illustrate, a portion of the method 700 of FIG. 7, a portion of the method 800 of FIG. 8, or a portion of the method 900 of FIG. 9 may be combined with other operations described herein. Additionally, one or more operations described with reference to the FIGS. 7-9 may be optional, may be performed at least partially concurrently, and/or may be performed in a different order than shown or described.

In an illustrative example, a processor may be programmed to apply a mapping to input data to generate transformed data. For example, the processor may execute instructions to apply a mapping to input data that includes a first set of m-tuples of bits to generate transformed data. The transformed data includes a second set of n-tuples of bits, where n is greater than m. A relationship of a gray coding of m-tuples of bits to a gray coding of n-tuples of bits is indicated by the mapping. The input data includes a first number of bit values that represent a particular logical state, and the transformed data includes a second number of bit values that represent the particular logical state, the second number of bit values being less than the first number of bit values. The processor may further execute instructions to store the transformed data at the memory.

In conjunction with the described aspects, a device includes means for performing error correction coding on user data to generate input data, where the input data includes one or more m-tuples of bits, and where the input data includes a first number of bit values that represent a particular logical state. The means for performing error correction coding may include or correspond to the ECC engine 164 of FIGS. 1 and 4-6, the data-shaping and ECC engine 202 of FIGS. 2 and 3, one or more other structures or circuits configured to perform error correction coding on the user data to generate input data, or any combination thereof.

The device further includes means for applying a mapping to the input data to generate transformed data, where the transformed data includes one or more n-tuples of bits, where n is greater than m, where a relationship of a gray coding of m-tuples of bits to a gray coding of n-tuples of bits is indicated by the mapping, and where the transformed data includes a second number of bit values that represent the particular logical state, the second number of bit values being less than the first number of bit values. The means for applying the mapping may include or correspond to the data shaping engine 162 of FIGS. 1 and 4-6, one or more other structures or circuits configured to apply the mapping to the input data to generate the transformed data, or any combination thereof.

In a particular implementation, the device may further include means for compressing the input data, where the input data is compressed prior to generation of the transformed data, and where the mapping is based at least partially on a compression level of the input data. The means for compressing the input data may include or correspond to the data compression engine 166 of FIG. 1 or FIG. 6, one or more other structures or circuits configured to compress the input data, or any combination thereof.

Although various components of the data storage device 102 and/or the access device 150 of FIGS. 1 and 2 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 700 of FIG. 7, the method 800 of FIG. 8, or the method 900 of FIG. 9. In a particular implementation, each of the controller 120, the memory 104, and/or the access device 150 of FIGS. 1 and 2 includes a processor executing instructions that are stored at a memory, such as a non-volatile memory of the data storage device 102 or the access device 150 of FIGS. 1 and 2. Alternatively or additionally, executable instructions that are executed by the processor may be stored at a separate memory location that is not part of the non-volatile memory, such as at a read-only memory (ROM) of the data storage device 102 or the access device 150 of FIGS. 1 and 2.

With reference to FIGS. 1 and 2, the data storage device 102 may be attached to or embedded within one or more access devices, such as within a housing of a communication device (e.g., the access device 150). For example, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, a system integrated within a vehicle, such as a console display unit, or other device that uses non-volatile memory. However, in other embodiments, the data storage device 102 may be implemented in a portable device configured to be selectively coupled to one or more external access devices. In still other embodiments, the data storage device 102 may be a component (e.g., a solid-state drive (SSD)) of a network accessible data storage system, such as an enterprise data system, a network-attached storage system, a cloud data storage system, etc.

To further illustrate, the data storage device 102 may be configured to be coupled to the access device 150 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a mini SD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In yet another particular implementation, the data storage device 102 is coupled to the access device 150 indirectly, e.g., via a network. For example, the data storage device 102 may be a network-attached storage (NAS) device or a component (e.g., a solid-state drive (SSD) device) of a data center storage system, an enterprise storage system, or a storage area network.

The memory 104 and/or the controller memory 160 of FIGS. 1 and 2 may include a resistive random access memory (ReRAM), a three-dimensional (3D) memory, a bit cost scalable flash memory (BiCS flash memory), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a magnetic device, a phase change memory (PCM), or a combination thereof. Alternatively, or in addition, the memory 104 and/or the controller memory 160 may include another type of memory. The memory 104 and/or the controller memory 160 of FIGS. 1 and 2 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information.

Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a memory; and
   a controller comprising a memory interface and a data shaping engine, the controller configured to:
      apply a mapping via the data shaping engine to input data to generate transformed data, the input data including one or more m-tuples of bits with a first number of bit values that represent a particular logical state in the memory, the particular logical state being a high-wear voltage of the memory, the transformed data including one or more n-tuples of bits with a second number of bit values that represent the particular logical state,
      wherein n is greater than m,
      wherein a relationship of a gray coding of m-tuples of bits to a gray coding of n-tuples of bits is indicated by the mapping,
      wherein the transformed data reduces wear at the memory based on the second number of bit values being less than the first number of bit values, and
      write, with the memory interface, the transformed data to the memory to store the one or more n-tuples of bits with the second number of bit values by modifying states of storage elements of the memory so that the transformed data is readable via detection by read circuitry of the modified states.

2. The data storage device of claim 1, wherein the gray coding of m-tuples of bits includes $2^m$ m-tuples of bits, and wherein the gray coding of n-tuples of bits includes a subset of $2^n$ possible n-tuples of bits.

3. The data storage device of claim 1, wherein the controller further comprises an error correction code (ECC) engine, wherein the ECC engine is configured to generate one or more ECC codewords based on user data, and wherein the input data comprises the one or more ECC codewords.

4. The data storage device of claim 3, wherein the controller further comprises a data compression engine configured to congress the user data prior to providing the user data to the ECC engine, wherein the data compression engine is further configured to compress the user data in accordance with a data throughput setting, wherein the ECC engine is further configured to generate the one or more ECC codewords in accordance with a bit error rate setting, and wherein the data shaping engine is configured to generate the transformed data having the same size as the user data prior to compression.

5. The data storage device of claim 1, wherein, in the gray coding of m-tuples of bits and the gray coding of n-tuples of bits, successive tuples of bits differ by a single bit.

6. The data storage device of claim 1, wherein the controller is further configured to store a key associated with the mapping at the memory, and wherein the key is an error correction code processed at the controller prior to storage.

7. The data storage device of claim 1, wherein the mapping includes a one-to-one encoding mapping of m-tuples of bits to n-tuples of bits and a many-to-one decoding mapping of groups of n-tuples of bits to m-tuples of bits.

8. The data storage device of claim 7, wherein the controller is further configured to read a first n-tuple of bits of the transformed data from the memory, and wherein the data shaping engine is configured to decode the first n-tuple of bits into a m-tuple of bits that corresponds to the first n-tuple of bits with the many-to-one decoding mapping.

9. The data storage device of claim 1, wherein, to apply, with the data shaping engine, the mapping to the input data to generate the transformed data, the data shaping engine is configured to select the mapping from a plurality of mappings stored in a controller memory of the controller.

10. The data storage device of claim 1, wherein the first number of bit values and the second number of bit values comprise single-bit values, and wherein the particular logical state is indicated by a single bit.

11. The data storage device of claim 1, wherein the first number of bit values and the second number of bit values comprise multi-bit values, and wherein the particular logical state is indicated by multiple bits.

12. A data storage device comprising:
    a memory; and
    a controller comprising a memory interface and a data shaping and error correction code (ECC) engine, the controller configured to
       use the data shaping and ECC engine to apply a mapping to input data to generate transformed data, the input data including one or more m-tuples of bits with a first number of bit values that represent a particular logical state in the memory, the particular logical state being a high-wear voltage of the memory, the transformed data including one or more n-tuples of bits with a second number of bit values that represent the particular logical state,
       wherein n is greater than m,
       wherein the mapping includes a one-to-one encoding mapping and a many-to-one decoding mapping,
       wherein the transformed data reduces wear at the memory based on the second number of bit values being less than the first number of bit values, and
       write, with the memory interface, the transformed data to the memory to store the one or more n-tuples of bits with the second number of bit values by modifying states of storage elements of the memory so that the transformed data is readable via detection by read circuitry of the modified states.

13. The data storage device of claim 12, wherein the data shaping and ECC engine is configured to maintain a particular difference level between at least two n-tuples of bits of the transformed data that correspond to different m-tuples of bits of the input data according to the many-to-one decoding mapping, and wherein the particular difference level is based on a number of bits that are different between the at least two n-tuples of bits or a position of the bits that are different between the at least two n-tuples of bits.

14. The data storage device of claim 12, wherein the controller further comprises a data compression engine configured to compress the input data prior to providing the input data to the data shaping and ECC engine.

15. The data storage device of claim 12, wherein the controller is further configured to store a key associated with the mapping at the memory, and wherein the key is an error correction code processed at the controller prior to storage.

16. The data storage device of claim 15, wherein the controller is further configured to read a representation of the transformed data from the memory, wherein the data shaping engine is configured to decode a first n-tuple of bits of the representation of the transformed data to generate first de-shaped data, and wherein the first de-shaped data includes a first m-tuple of bits having a particular value.

17. The data storage device of claim 16, wherein the data shaping engine is configured to decode a second n-tuple of bits of the representation of the transformed data to generate second de-shaped data, and wherein the second de-shaped data includes a second m-tuple of bits having the particular value.

18. The data storage device of claim 16, wherein the first de-shaped data is generated without determining a difference between the first n-tuple of bits and one or more n-tuples of bits in the many-to-one decoding mapping.

19. The data storage device of claim 12, wherein each possible n-tuple of bits is mapped to an m-tuple of bits in the many-to-one decoding mapping.

20. The data storage device of claim 12, wherein the first number of bit values and the second number of bit values comprise single-bit values, and wherein the particular logical state is indicated by a single bit.

21. The data storage device of claim 12, wherein the first number of bit values and the second number of bit values comprise multibit values, and wherein the particular logical state is indicated by multiple bits.

22. A method comprising:
applying, with a data shaping engine of a controller, a mapping to input data to generate transformed data, the input data including a first set of m-tuples of bits with a first number of bit values that represent a particular logical state in a memory, the particular logical state corresponding to a high-wear voltage of the memory, the transformed data including a first set of n-tuples of bits with a second number of bit values that represent the particular logical state,
wherein n is greater than m,
wherein a relationship of a gray coding of m-tuples of bits to a gray coding of n-tuples of bits is indicated by the mapping,
wherein the transformed data reduces wear at the memory based on the second number of bit values being less than the first number of bit values; and
writing, with a memory interface of the controller, the transformed data to the memory to store the first set of n-tuples of bits with the second number of bit values by modifying states of storage elements of the memory so that the transformed data is readable via detection by read circuitry of the modified states.

23. The method of claim 22, further comprising determining the mapping based on m and a shaping level of the transformed data, wherein the shaping level is associated with the second number of bit values of the transformed data that represent the particular logical state.

24. The method of claim 23, wherein determining the mapping comprises:
determining a particular m-tuple having a highest frequency in the input data; and
assigning a particular output n-tuple to the particular m-tuple based on the second number of bit values in the particular output n-tuple that represent the particular logical state.

25. The method of claim 23, further comprising:
determining a key associated with the mapping; and
storing the key at the memory.

26. The method of claim 22, further comprising:
modifying the mapping based on a distribution of m-tuples in the first set of m-tuples;
applying the modified mapping to a second set of m-tuples of bits to generate second transformed data; and
writing the second transformed data to the memory.

27. The method of claim 26, further comprising:
reading a representation of the second transformed data from the memory;
applying the modified mapping to n-tuples of bits of the representation of the second transformed data to decode the second transformed data, wherein the modified mapping includes an encoding mapping and a decoding mapping; and
further modifying the modified mapping based on a distribution of n-tuples in the representation of the second transformed data after error correction code processing is performed on the second transformed data.

28. The method of claim 27, further comprising
reading a representation of the transformed data from the memory; and
applying the further modified mapping to n-tuples of bits of the representation of the transformed data to decode the representation of the transformed data.

29. The method of claim 22, wherein, for each n-tuple of bits in the mapping, the n-tuple of bits has more bits having a first value and fewer bits having a second value than a corresponding m-tuple of bits, and wherein the mapping comprises an adaptive mapping that is modified based on inputs to the adaptive mapping and a previous state of the adaptive mapping.

30. The method of claim 22, further comprising:
receiving user data from an access device; and
compressing the user data to generate compressed data.

31. The method of claim 30, further comprising, prior to applying the mapping, encrypting the compressed data to generate the input data.

32. A method comprising:
applying, with a data shaping and error correction code (ECC) engine of a controller, a one-to-one encoding mapping to input data to generate transformed data, the input data including a first set of m-tuples of bits with a first number of bit values that represent a particular logical state in a memory, the particular logical state being a high-wear voltage of the memory, the transformed data including a first set of n-tuples of bits with a second number of bit values that represent the particular logical state,
wherein n is greater than m,
wherein the one-to-one encoding mapping is associated with a many-to-one decoding mapping,
wherein the transformed data reduces wear at the memory based on the second number of bit values being less than the first number of bit values; and
writing the transformed data to the memory to store the first set of n-tuples of bits with the second number of bit values by modifying states of storage elements of the memory so that the transformed data is readable via detection by read circuitry of the modified states.

33. The method of claim 32, further comprising:
storing a key associated with the one-to-one encoding mapping and the many-to-one decoding mapping in the memory; and
performing error correction code (ECC) processing on the key prior to storing the key.

34. The method of claim 32, further comprising:
reading a first n-tuple of bits from the memory;
applying the many-to-one decoding mapping to the first n-tuple of bits to generate first de-shaped data, the first de-shaped data including a particular m-tuple of bits;
reading a second n-tuple of bits from the memory; and
applying the many-to-one decoding mapping to the second m-tuple of bits to generate second de-shaped data, the second de-shaped data including the particular m-tuple of bits.

35. The method of claim 32, further comprising:
modifying the one-to-one encoding mapping based on a distribution of m-tuples in the first set of m-tuples;
applying the modified one-to-one encoding mapping to a second set of m-tuples of bits to generate second transformed data; and
writing the second transformed data to the memory.

36. The method of claim 32, further comprising:
reading a second set of n-tuples of bits from the memory;
applying the many-to-one decoding mapping to the second set of n-tuples of bits to generate first de-shaped data;
modifying the many-to-one decoding mapping based on a distribution of n-tuples in the second set of n-tuples;
reading a third set of n-tuples of bits from the memory; and
applying the modified many-to-one decoding mapping to the third set of n-tuples of bits to generate second de-shaped data.

37. The method of claim 32, further comprising compressing the input data prior to applying the one-to-one encoding mapping to the input data.

38. The method of claim 32, further comprising:
reading an n-tuple of bits from the memory;
performing error correction code (ECC) processing on the n-tuple of bits; and
applying the many-to-one decoding mapping to the n-tuple of bits to generate de-shaped data.

39. The method of claim 38, further comprising:
decrypting the de-shaped data to generate decrypted data; and
decompressing the de-shaped data to generate a representation of user data.

40. The method of claim 32, further comprising:
receiving an additional portion of the input data;
compressing the additional portion to generate compressed data;
encrypting the compressed data to generate encrypted data;
applying the one-to-one encoding mapping to the encrypted data to generate shaped data,
wherein the shaped data and the additional portion of the input data are substantially the same size;
performing error correction code (ECC) processing on the shaped data to generate encoded data and parity data;
rotating the parity data with respect to the encoded data to generate second transformed data; and
writing the second transformed data to the memory.

* * * * *